US009352602B2

(12) United States Patent
Ishiguro et al.

(10) Patent No.: US 9,352,602 B2
(45) Date of Patent: *May 31, 2016

(54) LITHOGRAPHIC PRINTING PLATE PRECURSOR AND METHOD FOR PRODUCING LITHOGRAPHIC PRINTING PLATE

(71) Applicant: FUJIFILM Corporation, Tokyo (JP)

(72) Inventors: Yuriko Ishiguro, Shizuoka (JP); Shota Suzuki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 65 days.

This patent is subject to a terminal disclaimer.

(21) Appl. No.: 14/227,246

(22) Filed: Mar. 27, 2014

(65) Prior Publication Data

US 2014/0208971 A1    Jul. 31, 2014

Related U.S. Application Data

(63) Continuation of application No. PCT/JP2012/072254, filed on Aug. 31, 2012.

(30) Foreign Application Priority Data

Sep. 30, 2011 (JP) .................................. 2011-218547

(51) Int. Cl.
*B41N 1/08* (2006.01)
*B41C 1/10* (2006.01)
*B41N 1/14* (2006.01)
*G03F 7/32* (2006.01)
(Continued)

(52) U.S. Cl.
CPC ...... *B41N 1/14* (2013.01); *B41C 1/10* (2013.01); *B41C 1/1016* (2013.01); *G03F 7/092* (2013.01); *G03F 7/32* (2013.01); *G03F 7/322* (2013.01); *G03F 7/033* (2013.01); *G03F 7/0388* (2013.01)

(58) Field of Classification Search
None
See application file for complete search history.

(56) References Cited

U.S. PATENT DOCUMENTS 8,435,720 B2 * 5/2013 Suzuki et al. ............. 430/273.1
8,722,310 B2 * 5/2014 Suzuki ...................... 430/271.1
(Continued)

FOREIGN PATENT DOCUMENTS

EP      2 042 312 A2    4/2009
EP      2302462 A2      3/2011
(Continued)

OTHER PUBLICATIONS

Communication dated Apr. 9, 2015 issued by the European Patent Office in counterpart European Patent Application No. 12834928.9.
(Continued)

*Primary Examiner* — Joshua D Zimmerman
(74) *Attorney, Agent, or Firm* — Sughrue Mion, PLLC

(57) ABSTRACT

A lithographic printing plate precursor includes a photosensitive layer and a protective layer in this order on a support, the photosensitive layer contains a sensitizing dye, a polymerization initiator, a polymerizable compound and a binder polymer, and the protective layer contains a polymer which has a repeating unit represented by the formula (1) as defined herein and a repeating unit represented by the formula (2) as defined herein in which a sum of the repeating unit represented by the formula (1) and the repeating unit represented by the formula (2) is 90% by mole or more based on total repeating units constituting the polymer.

11 Claims, 2 Drawing Sheets

(51) Int. Cl.
    *G03F 7/09*     (2006.01)
    *G03F 7/033*     (2006.01)
    *G03F 7/038*     (2006.01)

(56) References Cited

U.S. PATENT DOCUMENTS

| | | | |
|---|---|---|---|
| 2010/0221658 A1* | 9/2010 | Iwai et al. | 430/270.1 |
| 2012/0219911 A1* | 8/2012 | Suzuki et al. | 430/283.1 |
| 2013/0052586 A1* | 2/2013 | Suzuki | 430/283.1 |

FOREIGN PATENT DOCUMENTS

| | | |
|---|---|---|
| EP | 2339402 A1 | 6/2011 |
| EP | 2 492 751 A1 | 8/2012 |
| EP | 2492751 A1 | 8/2012 |
| EP | 2 565 714 A1 | 3/2013 |
| JP | 2007-090564 A | 4/2007 |
| JP | 2007-256685 A | 10/2007 |
| JP | 2009-056717 A | 3/2009 |
| JP | 2009-222928 A | 10/2009 |
| JP | 2010-150494 A | 7/2010 |
| JP | 2011-090295 A | 5/2011 |
| JP | 2011-154366 A | 8/2011 |
| WO | 2007/057349 A1 | 5/2007 |

OTHER PUBLICATIONS

International Search Report for PCT/JP2012/072254 dated Oct. 23, 2012 [PCT/ISA/210].
Written Opinion for PCT/JP2012/072254 dated Oct. 23, 2012 [PCT/ISA/237].

\* cited by examiner

LITHOGRAPHIC PRINTING PLATE PRECURSOR AND METHOD FOR PRODUCING LITHOGRAPHIC PRINTING PLATE

CROSS REFERENCE TO RELATED APPLICATION

This is a continuation of International Application No. PCT/JP2012/072254 filed on Aug. 31, 2012, and claims priority from Japanese Patent Application No. 2011-218547 filed on Sep. 30, 2011, the entire disclosures of which are incorporated herein by reference.

TECHNICAL FIELD

The present invention relates to a lithographic printing plate precursor and a method for producing a lithographic printing plate using the same. In particular, it relates to a lithographic printing plate precursor which is prevented from the occurrence of development scum without causing decrease in a development speed and provides a lithographic printing plate excellent in stain resistance and ink receptivity.

BACKGROUND ART

In general, a lithographic printing plate is composed of an oleophilic image area accepting ink and a hydrophilic non-image area accepting dampening water in the process of printing. Lithographic printing is a printing method utilizing the nature of water and printing ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (photosensitive layer, image-recording layer) has heretofore been broadly used. Ordinarily, the lithographic printing plate is obtained by conducting plate making according to a method of exposing the lithographic printing plate precursor through an original, for example, a lith film, and then removing the unnecessary portion of the image-recording layer by dissolving with an alkaline developer or an organic solvent thereby revealing the hydrophilic surface of support to form the non-image area while leaving the image-recording layer in the portion for forming the image area.

In recent years, digitalized technique of electronically processing, accumulating and outputting image information using a computer has been popularized, and various new image outputting systems responding to the digitalized technique have been put into practical use. Correspondingly, attention has been drawn to a computer-to-plate (CTP) technique of carrying digitalized image information on highly converging radiation, for example, laser light and conducting scanning exposure of a lithographic printing plate precursor with the light thereby directly producing a lithographic printing plate without using a lith film. Thus, it is one of important technical subjects to obtain a lithographic printing plate precursor adaptable to the technique described above.

Further, in the hitherto known plate making process of lithographic printing plate precursor, after exposure, the step of removing the unnecessary portion of the image-recording layer by dissolving, for example, with a developer is required. However, in view of the environment and safety, a processing with a developer closer to a neutral range and a small amount of waste liquid are problems to be solved. Particularly, since disposal of waste liquid discharged accompanying the wet treatment has become a great concern throughout the field of industry in view of the consideration for global environment in recent years, the demand for the resolution of the above-described problems has been increased more and more.

Thus, the decrease in alkali concentration of developer and the simplification of processing step have been further strongly required from both aspects of the consideration for global environment and the adaptation for space saving and low running cost. However, since hitherto known development processing comprises three steps of developing with an aqueous high alkali solution having pH of 11 or more, washing of the alkali agent with a water washing bath and then treating with a gum solution mainly comprising a hydrophilic resin as described above, an automatic development processor per se requires a large space and problems of the environment and running cost, for example, disposal of the development waste liquid, water washing waste liquid and gum waste liquid still remain.

In the case of performing a hitherto known development processing with the high alkali developer, removal of the photosensitive layer in the non-image area is carried out mainly by dissolving a binder polymer contained in the photosensitive layer with the high alkali developer. On the other hand, in the case of performing a development processing using a low alkali developer, for example, a developer having pH of 10 or less, removal of the photosensitive layer in the non-image area is carried out mainly by dispersing a binder polymer contained in the photosensitive layer with the low alkali developer. Therefore, for example, when the development processing is performed for a long period of time, deposit (development scum) generates along with the increase of the photosensitive layer component removed in the developer. Such a development scum not only adheres to a member, for example, a developing tank of an automatic development processor but also adheres to a lithographic printing plate after the development processing, thereby causing the occurrence of stain on a printed material.

In order to solve such a problem, a method in which development and gumming of an image-exposed lithographic printing plate precursor are carried out by a single processing using a gum processing device having a plurality of gum processing units in the transporting direction is proposed in Patent Document 1. However, even in the method, the problem causing by the development scum generated in the final gum processing unit exists in the case where the processing has been continued for a long period of time.

Further, in case of a lithographic printing plate precursor having a protective layer on the photosensitive layer, it is also necessary to perform removal of the protective layer. The removal of the protective layer can be carried out separately by a water washing treatment prior to the development processing, but taking the simplification of processing steps and space saving into consideration, it is desired to also remove the protective layer in the development processing step. Therefore, it is necessary to solve the problem of development scum resulting from the protective layer component.

With respect to a polymer used in the protective layer, for example, in Patent Document 2, a lithographic printing plate precursor of on-press development type having an overcoat layer containing a specific compound having a phosphoric acid group or a phosphoric monoester group or a hydrophilic resin having a phosphoric acid group or a phosphonic acid group together with an inorganic stratiform compound is described. Also, in Patent Document 3, a lithographic printing plate precursor having a protective layer containing polyvinyl alcohol having a saponification degree of 91% by mole or more, a specific amount of a mica compound and a water soluble copolymer containing (meth)acrylic acid or its ester is described. Further, in Patent Document 4, a lithographic printing plate precursor having a protective layer containing a specific polymer of (meth)acrylic ester having a long ethylene oxide chain or propylene oxide chain in its side chain together with a stratiform compound is described.

However, the protective layers containing these polymers are not sufficient for providing a lithographic printing plate excellent in stain resistance and ink receptivity while preventing from the occurrence of development scum without causing decrease in a development speed.

PRIOR ART DOCUMENT

Patent Document

Patent Document 1: WO 07/057349
Patent Document 2: JP-A-2007-90564
Patent Document 3: JP-A-2007-256685
Patent Document 4: JP-A-2009-56717

DISCLOSURE OF THE INVENTION

Problems that the Invention is to Solve

An object of the present invention is to provide a lithographic printing plate precursor which is prevented from the occurrence of development scum without causing decrease in a development speed and provides a lithographic printing plate excellent in stain resistance and ink receptivity. Also, another object of the invention is to provide a method for producing a lithographic printing plate using the lithographic printing plate precursor.

Means for Solving the Problems

As a result of the intensive investigations, the inventor has found that the objects described above can be achieved by incorporating a polymer having a specific structure into a protective layer to complete the invention.

Specifically, the present invention is as follows.

(1) A lithographic printing plate precursor having a photosensitive layer and a protective layer in this order on a support, wherein the photosensitive layer contains a sensitizing dye, a polymerization initiator, a polymerizable compound and a binder polymer, and the protective layer contains a polymer which contains a repeating unit represented by formula (1) shown below and a repeating unit represented by formula (2) shown below in which a sum of the repeating unit represented by formula (1) and the repeating unit represented by formula (2) is 90% by mole or more based on total repeating units constituting the polymer.

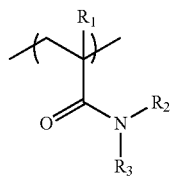

Formula (1)

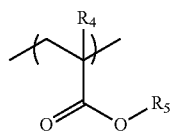

Formula (2)

In formulae (1) and (2), $R_1$ and $R_4$ each represents a hydrogen atom or a methyl group, $R_2$ and $R_3$, which may be the same or different, each represents a hydrogen atom, a methyl group or an ethyl group, and $R_5$ represents an unsubstituted alkyl group having from 1 to 8 carbon atoms or an alkyl group substituted with an aromatic group or a heterocyclic group.

(2) The lithographic printing plate precursor as described in (1) above, wherein the binder polymer is a polyvinyl butyral resin.

(3) The lithographic printing plate precursor as described in (1) or (2) above, wherein the protective layer contains an inorganic stratiform compound.

(4) A method for producing a lithographic printing plate comprising subjecting the lithographic printing plate precursor as described in any one of (1) to (3) above to image exposure and development processing.

(5) The method for producing a lithographic printing plate as described in (4) above, wherein the development processing is conducted with a developer having pH from 2.0 to 10.0.

(6) The method for producing a lithographic printing plate as described in (4) or (5) above, which does not contain a water washing treatment after the development processing.

(7) The method for producing a lithographic printing plate as described in any one of (4) to (6) above, wherein the development processing consists of a plurality of steps.

(8) The method for producing a lithographic printing plate as described in any one of (4) to (6) above, wherein the development processing consists of one step.

(9) The method for producing a lithographic printing plate as described in any one of (4) to (8) above, wherein a developer used in the development processing contains two or more kinds of surfactants.

Advantage of the Invention

According to the invention, a lithographic printing plate precursor which is prevented from the occurrence of development scum without causing decrease in a development speed and provides a lithographic printing plate excellent in stain resistance and ink receptivity can be provided. Also, the lithographic printing plate excellent in stain resistance and ink receptivity can be provided while preventing from the occurrence of development scum without causing decrease in a development speed by conducting the development processing consisting of a plurality of steps using the lithographic printing plate precursor. Further, the lithographic printing plate excellent in stain resistance and ink receptivity can also be provided while preventing from the occurrence of development scum without causing decrease in a development speed by conducting the development processing consisting of a single step using the lithographic printing plate precursor.

MODE FOR CARRYING OUT THE INVENTION

Lithographic Printing Plate Precursor

Figure 1:
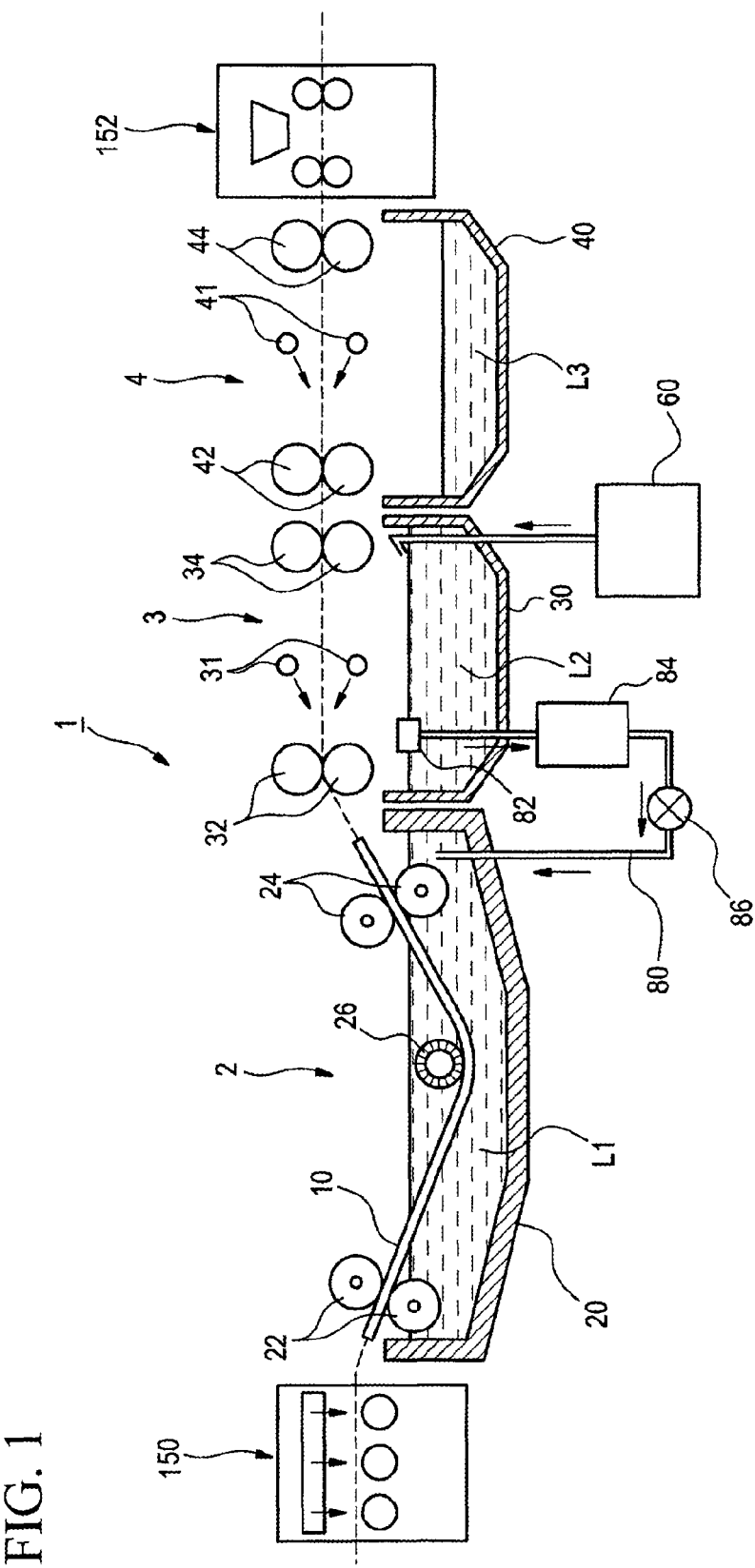
FIG. 1 is a schematic view showing a configuration of a development device for the lithographic printing plate precursor according to the invention.

The lithographic printing plate precursor according to the invention has a photosensitive layer and a protective layer in this order on a support. It may have an undercoat layer (intermediate layer) between the support and the photosensitive layer, if desired. Hereinafter, the configuration of the lithographic printing plate precursor is described in order.

[Protective Layer]

In the lithographic printing plate precursor according to the invention, the protective layer (oxygen blocking layer) is provided on the photosensitive layer in order to block diffusion and penetration of oxygen which obstructs a polymerization reaction at the time of exposure. The protective layer according to the invention is characterized by containing a polymer (hereinafter, also referred to as a specific polymer) which contains a repeating unit represented by formula (1) shown below and a repeating unit represented by formula (2) shown below in which a sum of the repeating unit represented by formula (1) and the repeating unit represented by formula (2) is 90% by mole or more based on the total repeating units constituting the polymer.

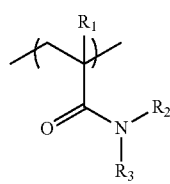

Formula (1)

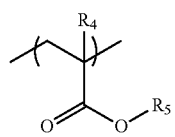

Formula (2)

In formulae (1) and (2), $R_1$ and 4 each represents a hydrogen atom or a methyl group, $R_2$ and $R_3$, which may be the same or different, each represents a hydrogen atom, a methyl group or an ethyl group, and $R_5$ represents an unsubstituted alkyl group having from 1 to 8 carbon atoms or an alkyl group substituted with an aromatic group or a heterocyclic group.

A number of carbon atoms included in the aromatic group on the alkyl group is preferably from 6 to 10, and more preferably from 6 to 8. The aromatic group may have a substituent. Examples of the substituent include a hydroxy group and an aliphatic group. Examples of the aromatic group include a phenyl group, a hydroxyphenyl group, a tolyl group and a naphthyl group.

The heterocyclic group preferably has a 5-membered ring or a 6-membered ring as the hetero ring. The hetero ring may be condensed with other hetero ring, an aliphatic ring or an aromatic ring. The heterocyclic group may have a substituent. Examples of the substituent include a hydroxy group, an oxo group (=O), a thioxo group (=S), an imino group (=NH), a substituted imino group (=H—R, wherein R is an aliphatic group, an aromatic group or a heterocyclic group) and an aliphatic group. Examples of the heterocyclic group include groups derived from a thiazole ring, a benzothiazole ring, a naphthothiazole ring (for example, a naphtho[2,1-d]thiazole ring or a naphtho[1,2-d]thiazole ring), a thionaphthene[7,6-d] ring, a benzoxazole ring, a naphthoxazole ring (for example, naphtho[2,1-d]oxazole ring), a selenazole ring, a benzoselenazole ring, a naphthoselenazole ring (for example, a naphtho[2,1-d]selenazole ring or a naphtho[1,2-d]selenazole ring), an oxazoline ring, a selenazoline ring, a thiazoline ring, a pyridine ring, a quinoline ring (for example, a 2-quinoline ring, a 4-quinoline ring or a benzo[t]quinoline ring), an isoquinoline ring (for example, a 1-isoquinoline ring, a 3-isoquinoline ring or a benzisoquinoline ring), an acridine ring, a 3,3-dialkylindolenine ring, a 3,3-dialkylbenzindolenine ring, a 3,3-dialkyl[1,7]diazo-2-indene ring, a benzimidazole ring and a naphtolactam ring.

In formulae (1) and (2), both $R_2$ and $R_3$ are preferably hydrogen atoms, and $R_5$ is preferably an unsubstituted alkyl group having from 1 to 8 carbon atoms, and particularly preferably a tert-butyl group.

Specific examples of a monomer constituting the repeating unit represented by formula (1) include acrylamide, methacrylamide, N-methylacrylamide, N-methylmethacrylamide, N-ethyl acrylamide, N-ethylmethacrylamide, N,N-dimethylacrylamide, N,N-dimethylmethacrylamide, N,N-diethylacrylamide, N,N-diethylmethacrylamide, N,N-ethylmethylacrylamide and N,N-ethylmethylmethacrylamide.

Specific examples of a monomer constituting the repeating unit represented by formula (2) include methyl acrylate, ethyl acrylate, propyl acrylate, isopropyl acrylate, n-butyl acrylate, isobutyl acrylate, tert-butyl acrylate, pentyl acrylate, hexyl acrylate, cyclohexyl acrylate, heptyl acrylate, octyl acrylate, 2-ethylhexyl acrylate, nonyl acrylate, decyl acrylate, methyl methacrylate, ethyl methacrylate, propyl methacrylate, isopropyl methacrylate, n-butyl methacrylate, isobutyl methacrylate, tert-butyl methacrylate, pentyl methacrylate, hexyl methacrylate, cyclohexyl methacrylate, heptyl methacrylate, octyl methacrylate and 2-ethylhexyl methacrylate.

The specific polymer according to the invention may contain a copolymerization component (hereinafter, also referred to as a third copolymerization component) other than the repeating unit represented by formula (1) and the repeating unit represented by formula (2), if desired.

The third copolymerization component preferably has a sulfonic acid group, a sulfonate group, a carbobetaine group, a sulfobetaine group or an ammonium group, and more preferably a sulfonic acid group, a sulfonate group or a sulfobetaine group, from the standpoint of water solubility and development property of the specific polymer.

Specific examples of a monomer constituting the repeating unit of the third copolymerization component include 2-acryloylamino-2-methylpropanesulfonic acid, sodium 2-acryloylamino-2-methylpropanesulfonate, potassium 2-acryloylamino-2-methylpropanesulfonate, 4-((3-methacrylamidopropyl)dimethylammonio)butane-1-sulfonate, 4-((3-acrylamidopropyl)dimethylammonio)butane-1-sulfonate, vinyl alcohol, acrylic acid, methacrylic acid, sodium styrenesulfonate, diethylene glycol 2-ethylhexyl methacrylate, hydroxyethyl acrylate, hydroxyethyl methacrylate, methacrylcholine chloride, potassium 3-sulfopropyl methacrylate, 2-(methacryloyloxy)ethyl phosphate and dimethyl-N-methacryloyloxyethyl-N-carboxymethyl-ammonium betaine.

Specific examples of the specific polymer according to the invention are set forth below, but the invention should not be construed as being limited thereto. In Tables 1 to 3, the numerals indicate the numbers of the specific polymers, respectively.

TABLE 1

Specific Polymers 1 to 45
Composition Ratio of Formula (1)/Formula (2) = 80/20 (% by mole), Mw = 30,000

| Formula (2) \ Formula (1) | –C(=O)NH₂ (acrylamide) | –C(=O)NH₂ (methacrylamide) | –C(=O)N(CH₃)₂ | –C(=O)NHCH₃ | –C(=O)NHC₂H₅ |
|---|---|---|---|---|---|
| ethyl ester | 1 | 10 | 19 | 28 | 37 |
| propyl ester | 2 | 11 | 20 | 29 | 38 |
| butyl ester | 3 | 12 | 21 | 30 | 39 |
| isobutyl ester | 4 | 13 | 22 | 31 | 40 |
| tert-butyl ester | 5 | 14 | 23 | 32 | 41 |
| hexyl ester | 6 | 15 | 24 | 33 | 42 |
| cyclohexyl ester | 7 | 16 | 25 | 34 | 43 |
| octyl ester | 8 | 17 | 26 | 35 | 44 |
| 2-ethylhexyl ester | 9 | 18 | 27 | 36 | 45 |

TABLE 2

Specific Polymers 46 to 57
Composition Ratio of Formula (1)/Formula (2) = 80/20 (% by mole)

Formula (1): –[CH2–CH(C(=O)NH2)]–

| Formula (2) | Mw | | | |
|---|---|---|---|---|
| | 200,000 | 100,000 | 50,000 | 10,000 |
| –[CH2–CH(C(=O)O–nBu)]– | 46 | 47 | 48 | 49 |
| –[CH2–CH(C(=O)O–iBu)]– | 50 | 51 | 52 | 53 |
| –[CH2–CH(C(=O)O–tBu)]– | 54 | 55 | 56 | 57 |

TABLE 3

Specific Polymers 58 to 69
Mw = 30,000

Formula (1): –[CH2–CH(C(=O)NH2)]–

| Formula (2) | Composition Ratio of Formula (1)/Formula (2) (% by mole) | | | |
|---|---|---|---|---|
| | 95/5 | 90/10 | 85/15 | 70/30 |
| –[CH2–CH(C(=O)O–nBu)]– | 58 | 59 | 60 | 61 |
| –[CH2–CH(C(=O)O–iBu)]– | 62 | 63 | 64 | 65 |
| –[CH2–CH(C(=O)O–tBu)]– | 66 | 67 | 68 | 69 |

70: Copolymer of acrylamide (x), ethyl acrylate (y), and N-(2-methyl-2-sulfonatopropyl)acrylamide sodium salt (z)

71: Copolymer of acrylamide (x), n-butyl acrylate (y), and N-(2-methyl-2-sulfonatopropyl)acrylamide sodium salt (z)

72: Copolymer of acrylamide (x), isobutyl acrylate (y), and N-(2-methyl-2-sulfonatopropyl)acrylamide sodium salt (z)

73: Copolymer of acrylamide (x), tert-butyl acrylate (y), and N-(2-methyl-2-sulfonatopropyl)acrylamide sodium salt (z)

74: Copolymer of acrylamide (x), n-hexyl acrylate (y), and N-(2-methyl-2-sulfonatopropyl)acrylamide sodium salt (z)

75: Copolymer of acrylamide (x), cyclohexyl acrylate (y), and N-(2-methyl-2-sulfonatopropyl)acrylamide sodium salt (z)

76: Polyacrylamide (x)

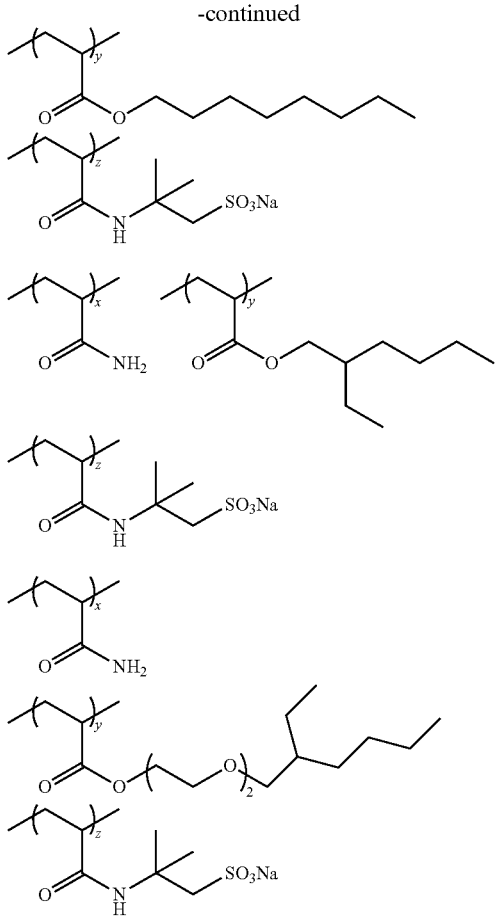

77

78

As to Specific Polymers 70 to 78 described above, the composition ratio of x/y/z is 74/25/1 (% by mole) and Mw is 20,000.

In the specific polymer, each of the repeating unit represented by formula (1), the repeating unit represented by formula (2) and the repeating unit derived from the third copolymerization component included, if desired, may be used two or more thereof.

In the case where the specific polymer is composed of the repeating unit represented by formula (1) and the repeating unit represented by formula (2), it is preferred to contain from 70 to 95% by mole of the repeating unit represented by formula (1) and from 5 to 30% by mole of the repeating unit represented by formula (2), more preferred to contain from 70 to 80% by mole of the repeating unit represented by formula (1) and from 20 to 30% by mole of the repeating unit represented by formula (2), and particularly preferred to contain from 75 to 80% by mole of the repeating unit represented by formula (1) and from 20 to 25% by mole of the repeating unit represented by formula (2).

In the case where the specific polymer contains the repeating unit derived from the third copolymerization component, a ratio of the repeating unit derived from the third copolymerization component is less than 10% by mole, preferably less than 5% by mole, particularly preferably less than 3% by mole, based on the total repeating units constituting the polymer.

The weight average molecular weight (Mw) of the specific polymer is preferably from 10,000 to 200,000, more preferably from 10,000 to 100,000, and particularly preferably from 10,000 to 30,000.

The dry coating amount of the specific polymer is preferably from 0.01 to 5.0 g, more preferably from 0.01 to 1.0 g, and particularly preferably from 0.02 to 0.8 g.

In the protective layer according to the invention, other polymer may be used together with the specific polymer of the invention, if desired. As the polymer which can be used, for example, a water-soluble polymer relatively excellent in crystallizability is preferred. Specifically, polyvinyl alcohol provides good result in the characteristic, for example, an oxygen-blocking property or removability by development.

The polyvinyl alcohol used together in the protective layer may be partially substituted with ester, ether or acetal as long as it contains unsubstituted vinyl alcohol units for achieving the necessary oxygen-blocking property and solubility in water. Also, it may partly have other copolymerization component. Polyvinyl alcohol is obtained by hydrolysis of polyvinyl acetate. As the polyvinyl alcohols, those having a hydrolysis degree of 71 to 100% by mole and a polymerization repeating unit number of 300 to 2,400 are preferably exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (produced by Kuraray Co., Ltd.). Polyvinyl alcohols can be used individually or as a mixture of two or more thereof.

Also, modified polyvinyl alcohol can be preferably used. Particularly, an acid-modified polyvinyl alcohol having a carboxylic acid group or a sulfonic acid group is preferably used. Further, as a component used as a mixture with polyvinyl alcohol, polyvinyl pyrrolidone or a modified product thereof is preferred from the standpoint of the oxygen-blocking property and removability by development.

The content of the specific polymer in the protective layer according to the invention is preferably from 30 to 98% by weight, more preferably from 40 to 95% by weight, still more preferably from 50 to 90% by weight, based on the total polymers included in the protective layer.

To the protective layer, glycerin, dipropylene glycol or the like can be added to impart flexibility. Further, an anionic surfactant, for example, sodium alkylsulfate or sodium alkylsulfonate, an amphoteric surfactant, for example, alkylaminocarboxylate and alkylaminodicarboxylate, or a nonionic surfactant, for example, polyoxyethylene alkyl phenyl ether can be added to the protective layer.

Moreover, it is preferred to incorporate an inorganic stratiform compound into the protective layer according to the invention for the purpose of improving the oxygen-blocking property and property for protecting the surface of photosensitive layer.

The inorganic stratiform compound is a particle having a thin tabular shape and includes, for instance, mica, for example, natural mica represented by the following formula: $A(B, C)_{2-5}D_4O_{10}(OH, F, O)_2$, (wherein A represents any of Li, K, Na, Ca, Mg and an organic cation, B and C each represents any of Fe(II), Fe(III), Mn, Al, Mg and V, and D represents Si or Al) or synthetic mica, talc represented by the following formula: $3Mg.4SiO.H_2O$, taeniolite, montmorillonite, saponite, hectorite and zirconium phosphate.

Examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilicic mica $KMg_{2.5}(Si_4O_{10})F_2$, and swellable mica, for example, Na tetrasilicic mica $NaMg_{2.5}(Si_4O_{10})F_2$, Na or Li taeniolite (Na, Li)Mg$_2$Li(Si$_4$O$_{10}$)F$_2$, or montmorillonite-based Na or Li hectorite (Na, Li)$_{1/8}$Mg$_{2/5}$Li$_{1/8}$(Si$_4$O$_{10}$)F$_2$. Synthetic smectite is also useful.

Of the inorganic stratiform compounds, fluorine-based swellable mica, which is a synthetic inorganic stratiform compound, is particularly useful. Specifically, the swellable synthetic mica and an swellable clay mineral, for example, montmorillonite, saponite, hectorite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, Li$^+$, Na$^+$, Ca$^{2+}$, Mg$^{2+}$ or an organic cation is adsorbed between the lattice layers. The inorganic stratiform compound swells upon contact with water. When share is applied under such condition, the stratiform crystal lattices are easily cleaved to form a stable sol in water. The bentnite and swellable synthetic mica have strongly such tendency.

As to the shape of the inorganic stratiform compound, from the standpoint of control of diffusion of the inorganic stratiform compound, the thinner the thickness or the larger the plain size as long as smoothness of coated surface and transmission of actinic radiation are not damaged, the better. Therefore, an aspect ratio of the inorganic stratiform compound is preferably 20 or more, more preferably 100 or more, and particularly preferably 200 or more. The aspect ratio is a ratio of major axis to thickness of particle and can be determined, for example, from a projection drawing of particle by a microphotography. The larger the aspect ratio, the greater the effect obtained.

As to the particle diameter of the inorganic stratiform compound, an average diameter thereof is preferably from 1 to 20 µm, more preferably from 1 to 10 µm, and particularly preferably from 2 to 5 µm. When the particle diameter is less than 1 µm, the inhibition of penetration of oxygen or moisture is insufficient and the effect of the inorganic stratiform compound cannot be satisfactorily achieved. On the other hand, when it is 20 µm or more, the dispersion stability of the particle in the coating solution is insufficient to cause a problem in that the stable coating cannot be conducted. An average thickness of the particle is preferably 0.1 µm or less, more preferably 0.05 µm or less, and particularly preferably 0.01 µm or less. For example, with respect to the swellable synthetic mica that is the representative compound of the inorganic stratiform compound, the thickness is approximately from 1 to 50 nm and the plain size is approximately from 1 to 20 µm.

When such an inorganic stratiform compound particle having a large aspect ratio is incorporated into the photosensitive layer, strength of the coated layer increases and penetration of oxygen or moisture can be effectively inhibited and thus, the photosensitive layer can be prevented from deterioration due to deformation, and even when the lithographic printing plate precursor is preserved for a long period of time under a high humidity condition, it is prevented from decrease in the image-forming property of the lithographic printing plate precursor due to the change of humidity and the effect of excellent preservation stability can be obtained.

The coating amount of the protective layer is preferably from 0.05 to 10 g/m$^2$ in terms of the coating amount after drying, and it is more preferably from 0.1 to 2.0 g/m$^2$ in the case where the protective layer contains the inorganic stratiform compound and it is more preferably from 0.5 to 5 g/m$^2$ in the case where the protective layer does not contain the inorganic stratiform compound.

[Photosensitive Layer]

In the lithographic printing plate precursor according to the invention, the photosensitive layer (hereinafter, also referred to as an image-recording layer) contains a sensitizing dye, a polymerization initiator, a polymerizable compound and a binder polymer.

(A) Sensitizing Dye

The photosensitive layer according to the invention contains a sensitizing dye. The sensitizing dye can be used without particular restriction as far as it absorbs light at the image exposure to form the excited state and provides energy to the polymerization initiator described hereinafter with electron transfer, energy transfer or heat generation thereby increasing the polymerization initiation function. In particularly, a sensitizing dye having an absorption maximum in a wavelength range from 300 to 450 nm or from 750 to 1,400 nm is preferably used.

Examples of the sensitizing dye having an absorption maximum in a wavelength range from 300 to 450 nm include merocyanine dyes, benzopyranes, coumarins, aromatic ketones and anthracenes.

Of the sensitizing dyes having an absorption maximum in a wavelength range from 300 to 450 nm, a dye represented by formula (IX) shown below is more preferred from the standpoint of high sensitivity.

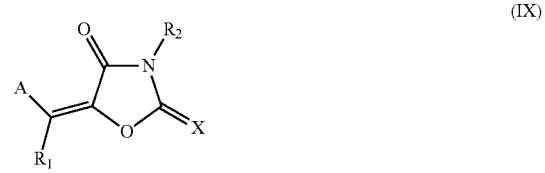

(IX)

In formula (IX), A represents an aromatic cyclic group which may have a substituent or a heterocyclic group which may have a substituent, X represents an oxygen atom, a sulfur atom or N—(R$_3$), and R$_1$, R$_2$ and R$_3$ each independently represents a monovalent non-metallic atomic group, or A and R$_1$ or R$_2$ and R$_3$ may be combined with each other to form an aliphatic or aromatic ring.

In formula (IX), R$_1$, R$_2$ and R$_3$ each independently represents a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

A represents an aromatic cyclic group which may have a substituent or a heterocyclic group which may have a substituent, and specific examples of the aromatic cyclic group which may have a substituent or a heterocyclic group which may have a substituent include those same as the substituted or unsubstituted aryl group or substituted or unsubstituted aromatic heterocyclic residue described for R$_1$, R$_2$ and R$_3$.

As specific examples of these sensitizing dyes, compounds described in Paragraph Nos. [0047] to [0053] of JP-A-2007-58170 are preferably used.

Further, sensitizing dyes represented by formulae (V) and (VI) shown below can also be used.

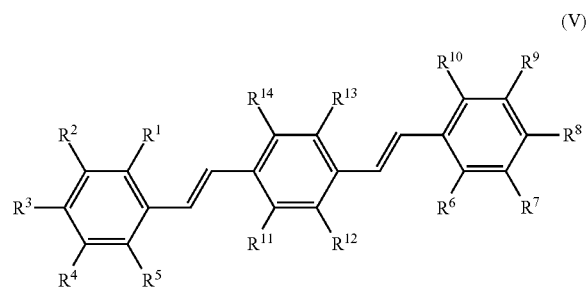

(V)

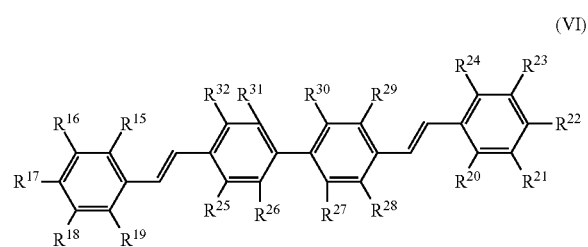

(VI)

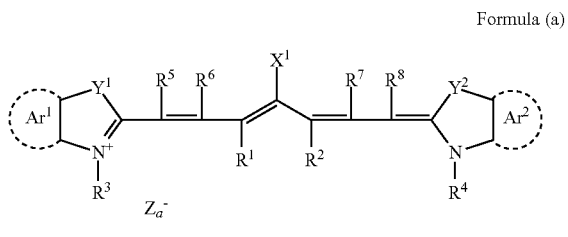

Formula (a)

In formula (a), $X^1$ represents a hydrogen atom, a halogen atom, $-NPh_2$, $-X^2-L^1$ or a group shown below. $X^2$ represents an oxygen atom or a sulfur atom, $L^1$ represents a hydrocarbon group having from 1 to 12 carbon atoms, an aromatic cyclic group containing a hetero atom (a nitrogen atom, a sulfur atom, an oxygen atom, a halogen atom or a selenium atom) or a hydrocarbon group having from 1 to 12 carbon atoms and containing a hetero atom. $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

In formula (V), $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms.

In formula (VI), $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

As specific examples of these sensitizing dyes, compounds described in EP-A-1,349,006 and WO 2005/029187 are preferably used.

Further, sensitizing dyes described in JP-A-2007-171406, JP-A-2007-206216, JP-A-2007-206217, JP-A-2007-225701, JP-A-2007-225702, JP-A-2007-316582 and JP-A-2007-328243 can also be preferably used.

Next, the sensitizing dye having an absorption maximum in a wavelength range from 750 to 1,400 (hereinafter, also referred to as an "infrared absorbing agent") is described in detail. The infrared absorbing agent used is preferably a dye or pigment.

As the dye, commercially available dyes and known dyes described in literatures, for example, *Senryo Binran* compiled by The Society of Synthetic Organic Chemistry, Japan (1970) can be utilized. Specifically, the dyes include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Of the dyes, cyanine dyes, squarylium dyes, pyrylium dyes, nickel thiolate complexes and indolenine cyanine dyes are preferred. The cyanine dyes and indolenine cyanine dyes are more preferred. As particularly preferred examples of the dye, a cyanine dye represented by formula (a) shown below is exemplified.

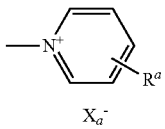

$R^1$ and $R^2$ each independently represents a hydrocarbon group having from 1 to 12 carbon atoms. In view of the preservation stability of a coating solution for photosensitive layer, it is preferred that $R^1$ and $R^2$ each represents a hydrocarbon group having two or more carbon atoms. Also, it is preferred that $R^1$ and $R^2$ are combined with each other to form a 5-membered ring or 6-membered ring.

$Ar^1$ and $Ar^2$, which may be the same or different, each represents an aromatic hydrocarbon group which may have a substituent. Preferred examples of the aromatic hydrocarbon group include a benzene ring group and a naphthalene ring group. Preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. The counter anion for $Za^-$ preferably includes a halide ion, a perchlorate ion, a tetrafluoroborate ion, a hexafluorophosphate ion and a sulfonate ion, and particularly preferably a perchlorate ion, a hexafluorophosphate ion and an arylsulfonate ion in view of the preservation stability of a coating solution for photosensitive layer.

Specific examples of the cyanine dye represented by formula (a) which can be preferably used include compounds described in Paragraph Nos. [0017] to [0019] of JP-A-2001-133969.

Further, as other particularly preferred example, specific indolenine cyanine dyes described in JP-A-2002-278057 are exemplified.

As the pigment, commercially available pigments and pigments described in Colour Index (C.I.), *Saishin Ganryo Binran* compiled by Pigment Technology Society of Japan (1977), *Saishin Ganryo Oyo Gijutsu*, CMC Publishing Co., Ltd. (1986) and *Insatsu Ink Gijutsu*, CMC Publishing Co., Ltd. (1984) can be utilized.

The addition amount of the sensitizing dye is preferably from 0.05 to 30 parts by weight, more preferably from 0.1 to 20 parts by weight, particularly preferably from 0.2 to 10 parts by weight, per 100 parts by weight of the total solid content of the photosensitive layer.

(B) Polymerization Initiator

The photosensitive layer according to the invention contains a polymerization initiator (hereinafter, also referred to as an initiator compound). In the invention, a radical polymerization initiator is preferably used.

As the initiator compound according to the invention, initiator compounds known to those skilled in the art can be used without limitation. Specifically, the initiator compound includes, for example, a trihalomethyl compound, a carbonyl compound, an organic peroxide, an azo compound, an azide compound, a metallocene compound, a hexaarylbiimidazole compound, an organic boron compound, a disulfone compound, an oxime ester compound, an onium salt compound and an iron arene complex. Among them, at least one compound selected from the hexaarylbiimidazole compound, onium salt compound, trihalomethyl compound and metallocene compound is preferred, and the hexaarylbiimidazole compound is particularly preferred. Two or more kinds of the polymerization initiator may be appropriately used in combination.

The hexaarylbiimidazole compound includes, for example, lophine dimers described in JP-B-45-37377 and JP-B-44-86516, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole. The hexaarylbiimidazole compound is particularly preferably used together with the sensitizing dye having an absorption maximum in a wavelength range from 300 to 450 nm.

The onium salt compound preferably used in the invention includes a sulfonium salt, an iodonium salt and a diazonium salt. Particularly, a diaryliodonium salt or a triarylsulfonium salt is preferably used. The onium salt compound is particularly preferably used together with the infrared absorbing agent having an absorption maximum in a wavelength range from 750 to 1,400 nm.

In addition, polymerization initiators described in Paragraph Nos. [0071] to [0129] of JP-A-2007-206217 are also preferably used.

The polymerization initiators are preferably used individually or in combination of two or more thereof. The amount of the polymerization initiator used in the photosensitive layer is preferably from 0.01 to 20% by weight, more preferably from 0.1 to 15% by weight, still more preferably from 1.0 to 10% by weight, based on the total solid content of the photosensitive layer.

(C) Polymerizable Compound

The photosensitive layer according to the invention contains a polymerizable compound. The polymerizable compound is an addition-polymerizable compound having at least one ethylenically unsaturated double bond and it is selected from compounds having at least one, preferably two or more, terminal ethylenically unsaturated bonds. The polymerizable compound has a chemical form, for example, a monomer, a prepolymer, specifically, a dimer, a trimer or an oligomer, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with a polyhydric alcohol compound and amides of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group, with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxyethoxy)phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used.

Also, a photo-oxidizable polymerizable compound described in JP-T-2007-506125 is preferred and a polymerizable compound containing at least one urea group and/or tertiary amino group is particularly preferred. Specifically, the compound set forth below is exemplified.

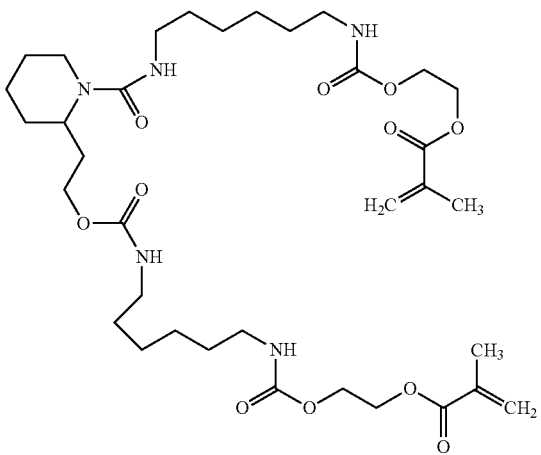 [SMILES: C=C(C)C(=O)OCCOC(=O)NCCCCCCNC(=O)OCCC1CCCCN1C(=O)NCCCCCCNC(=O)OCCOC(=O)C(=C)C]

Details of the method of using the polymerizable compound, for example, selection of the structure, individual or combination use or an amount added, can be appropriately determined in accordance with the characteristic design of the final lithographic printing plate precursor. The polymerizable compound is used preferably in a range from 5 to 75% by weight, more preferably in a range from 25 to 70% by weight, particularly preferably in a range from 30 to 60% by weight, based on the total solid content of the photosensitive layer.

(D) Binder Polymer

The photosensitive layer according to the invention contains a binder polymer. As the binder polymer, a polymer capable of holding the components of the photosensitive layer on a support and capable of being removed with a developer is used. The binder polymer used includes a (meth)acrylic polymer, a polyurethane resin, a polyvinyl alcohol resin, a polyvinyl butyral resin, a polyvinyl formal resin, a polyimide resin, a polyester resin and an epoxy resin. Particularly, a (meth)acrylic polymer, a polyurethane resin or a polyvinyl butyral resin is preferably used.

The term "(meth)acrylic polymer" as used herein means a copolymer containing as a polymerization component, (meth)acrylic acid or a (meth)acrylic acid derivative, for example, a (meth)acrylate (including, for example, an alkyl ester, aryl ester and allyl ester), (meth)acrylamide or a (meth) acrylamide derivative. The term "polyurethane resin" as used herein means a polymer formed by a condensation reaction of a compound having two or more isocyanate groups and a compound having two or more hydroxy groups. The term "polyvinyl butyral resin" as used herein means a polymer synthesized by a reaction (acetalization reaction) of polyvinyl alcohol obtained by partial or full saponification of polyvinyl acetate with butylaldehyde under an acidic condition and includes a polymer wherein an acid group or the like is introduced by a method of reacting the remaining hydroxy group with a compound having the acid group or the like.

As one preferred example of the binder polymer according to the invention, a copolymer containing a repeating unit having an acid group is exemplified. Examples of the acid group include a carboxylic acid group, a sulfonic acid group, a phosphonic acid group, a phosphoric acid group and a sulfonamido group. Particularly, a carboxylic acid group is preferred, and a repeating unit derived from (meth)acrylic acid or a repeating unit represented by formula (I) shown below is preferably used.

In formula (I), $R^1$ represents a hydrogen atom or a methyl group, $R^2$ represents a single bond or an (n+1) valent connecting group, A represents an oxygen atom or $-NR^3-$, wherein $R^3$ represents a hydrogen atom or a monovalent hydrocarbon group having from 1 to 10 carbon atoms, and n represents an integer from 1 to 5.

The connecting group represented by $R^2$ in formula (I) is constructed from a hydrogen atom, an oxygen atom, a nitrogen atom, a sulfur atom and a halogen atom and preferably contains from 1 to 80 atoms. Specific examples of the connecting group include an alkylene group, a substituted alkylene group, an arylene group and a substituted arylene group. The connecting group may have a structure wherein a plurality of such divalent groups is connected to each other through an amido bond or an ester bond. $R^2$ is preferably a single bond, an alkylene group or a substituted alkylene group, particularly preferably a single bond, an alkylene group having from 1 to 5 carbon atoms or a substituted alkylene group having from 1 to 5 carbon atoms, and most preferably a single bond, an alkylene group having from 1 to 3 carbon atoms or a substituted alkylene group having from 1 to 3 carbon atoms.

Examples of the substituent include a monovalent nonmetallic atomic group, for example, a halogen atom (e.g., —F, —Br, —Cl or —I), a hydroxy group, an alkoxy group, an aryloxy group, a mercapto group, an acyl group, a carboxyl group and a conjugate base group thereof, an alkoxycarbonyl group, an aryloxycarbonyl group, a carbamoyl group, an aryl group, an alkenyl group and an alkynyl group.

$R^3$ is preferably a hydrogen atom or a hydrocarbon group having from 1 to 5 carbon atoms, particularly preferably a hydrogen atom or a hydrocarbon group having from 1 to 3 carbon atoms, and most preferably a hydrogen atom or a methyl group. n is preferably from 1 to 3, particularly preferably 1 or 2, and most preferably 1.

A ratio (% by mole) of the copolymerization component having a carboxylic acid group in the total copolymerization components of the binder polymer is preferably from 1 to 70% from the standpoint of development property. Taking good compatibility between the development property and the printing durability into consideration, it is more preferably from 1 to 50%, and particularly preferably from 1 to 30%.

Further, a polyvinyl butyral resin having an acid group introduced, for example, a polyvinyl butyral resin shown below is also preferably used.

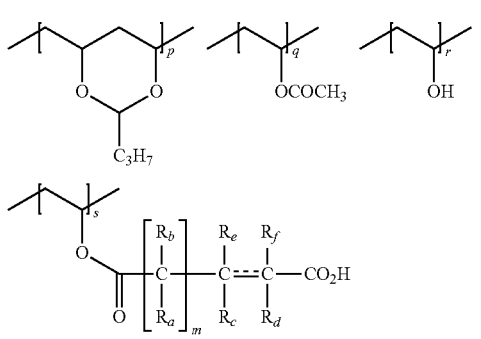

In formula (II), a ratio of each repeating unit p/q/r/s is preferably in a range from 50 to 78% by mole/from 1 to 5% by mole/from 5 to 28% by mole/from 5 to 20% by mole. $R_a$, $R_b$, $R_c$, $R_d$, $R_e$ and $R_f$ each independently represents a hydrogen atom, a monovalent substituent which may have a substituent or a single bond, and m represents an integer from 0 to 1. Preferred examples of any one of $R_a$, $R_b$, $R_c$, $R_d$, $R_e$ and $R_f$ include a hydrogen atom, an alkyl group which may have a substituent, a halogen atom and an aryl group which may have a substituent. More preferred examples thereof include a hydrogen atom, a straight-chain alkyl group, for example, a methyl group, an ethyl group or a propyl group, an alkyl group substituted with a carboxylic acid, a halogen atom, a phenyl group and a phenyl group substituted with a carboxylic acid. $R_c$ and $R_d$ or $R_e$ and $R_f$ may be combined with each other to form a ring structure. The bond between the carbon atom to which $R_c$ and $R_e$ connect and the carbon atom to which $R_d$ and $R_f$ connect is a single bond, a double bond or an aromatic double bond and in the case of the double bond or aromatic double bond, $R_c$ and $R_d$, $R_e$ and $R_f$, $R_c$ and $R_f$ or $R_e$ and $R_d$ are connected with each other to from a single bond.

Preferred specific examples of the repeating unit having a carboxylic acid group described above are set forth below.

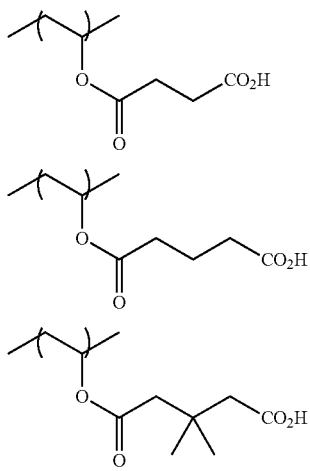

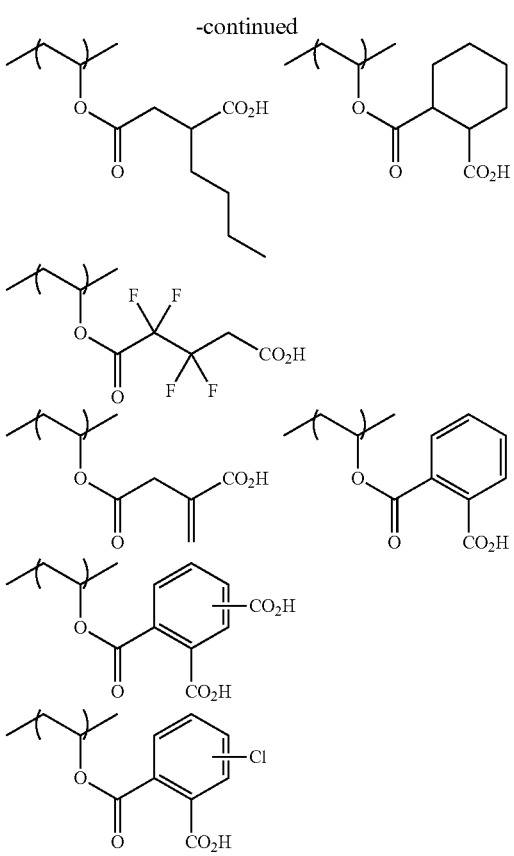

Moreover, the acid group of a polymer having an acid group which is a preferred example of the binder polymer according to the invention may be neutralized with a basic compound. Particularly, it is preferred to be neutralized with a compound having a basic nitrogen atom, for example, an amino group, an amidine group or a guanidine group. It is also preferred that the compound having a basic nitrogen atom has an ethylenically unsaturated group. Specific examples of the compound include compounds described in WO 2007/057442.

It is preferred that the binder polymer for use in the invention further contain a crosslinkable group. The term "crosslinkable group" as used herein means a group capable of crosslinking the binder polymer in the process of a radical polymerization reaction which is caused in the photosensitive layer, when the lithographic printing plate precursor is exposed to light. The crosslinkable group is not particularly restricted as long as it has such a function and includes, for example, an ethylenically unsaturated bond group, an amino group and an epoxy group as a functional group capable of undergoing an addition polymerization reaction. Also, a functional group capable of forming a radical upon irradiation with light may be used and such a crosslinkable group includes, for example, a thiol group and a halogen atom. Among them, the ethylenically unsaturated bond group is preferred. The ethylenically unsaturated bond group preferably includes a styryl group, a (meth)acryloyl group and an allyl group.

In the binder polymer, for example, a free radical (a polymerization initiating radical or a propagating radical in the process of polymerization of the polymerizable compound) is added to the crosslinkable functional group to cause addition polymerization between the polymers directly or through a polymerization chain of the polymerizable compound and as a result, crosslinking is formed between the polymer molecules to effect curing. Alternatively, an atom (for example, a hydrogen atom on the carbon atom adjacent to the functional crosslinkable group) in the polymer is withdrawn by a free radical to produce a polymer radical and the polymer radicals combine with each other to form crosslinking between the polymer molecules to effect curing.

The content of the crosslinkable group (content of radical-polymerizable unsaturated double bond determined by iodine titration) in the binder polymer is preferably from 0.01 to 10.0 mmol, more preferably from 0.05 to 5.0 mmol, particularly preferably from 0.1 to 2.0 mmol, per g of the binder polymer.

The binder polymer for use in the invention may contain a polymerization unit of alkyl (meth)acrylate or aralkyl (meth) acrylate besides the polymerization unit having an acid group and the polymerization unit having a crosslinkable group. The alkyl group in the alkyl (meth)acrylate is preferably an alkyl group having from 1 to 5 carbon atoms and more preferably a methyl group. The aralkyl (meth)acrylate includes, for example, benzyl (meth)acrylate.

The binder polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder polymers may be used individually or in combination of two or more thereof. The content of the binder polymer is preferably from 5 to 75% by weight, more preferably from 10 to 70% by weight, still more preferably from 10 to 60% by weight, based on the total solid content of the photosensitive layer from the standpoint of good strength of the image area and good image-forming property.

The total content of the polymerizable compound and the binder polymer is preferably 80% by weight or less based on the total solid content of the photosensitive layer. When it exceeds 80% by weight, decrease in the sensitivity and deterioration in the developing property may be caused sometimes. The total content is more preferably from 35 to 75% by weight.

According to the invention, by controlling a ratio of the polymerizable compound to the binder polymer contained in the photosensitive layer of the lithographic printing plate precursor, the permeability of developer into the photosensitive layer more increases and the development property is further improved. Specifically, a weight ratio of polymerizable compound/binder polymer in the photosensitive layer is preferably 1.2 or more, more preferably from 1.25 to 4.5, and particularly preferably from 2 to 4.

<Other Components for Photosensitive Layer>

The photosensitive layer preferably contains a chain transfer agent in addition to the components described above. As the chain transfer agent, for example, compounds having SH, PH, SiH or GeH in their molecules are used. The compound donates hydrogen to a low active radical species to generate a radical or is oxidized and deprotonized to generate a radical.

In particular, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used as the chain transfer agent.

Into the photosensitive layer, various additives can be further incorporated, if desired. Examples of the additive include a surfactant for progressing the development property and improving the surface state of coated layer, a microcapsule for providing good compatibility between the development property and the printing durability, a hydrophilic polymer for improving the development property and dispersion stability of microcapsule, a coloring agent or print-out agent for visually distinguishing the image area from the non-image area, a polymerization inhibitor for preventing undesirable thermal polymerization of the radical polymerizable compound during the production and preservation of the photosensitive layer, a higher fatty acid derivative for avoiding polymerization inhibition due to oxygen, a fine inorganic particle for increasing strength of the cured layer in the image area, a hydrophilic low molecular weight compound for improving the development property, a co-sensitizer or chain transfer agent for increasing sensitivity and a plasticizer for improving plasticity. As the additives, known compounds are used and, for example, compounds described in Paragraph Nos. [0161] to [0215] of JP-A-2007-206217 are used.

<Formation of Photosensitive Layer>

The photosensitive layer according to the invention is formed by dissolving or dispersing each of the necessary components described above in an appropriate solvent to prepare a coating solution and coating the coating solution on a support. The solvent used include, for example, methyl ethyl ketone, ethylene glycol monomethyl ether, 1-methoxy-2-propanol, 2-methoxyethyl acetate, 1-methoxy-2-propyl acetate and γ-butyrolactone, but the invention should not be construed as being limited thereto. The solvents may be used individually or as a mixture. The solid content concentration of the coating solution is preferably from 1 to 50% by weight.

The coating amount (solid content) of the photosensitive layer on a support obtained after drying is preferably from 0.3 to 3.0 g/m$^2$. In order to coat the photosensitive layer, various methods can be used for the coating. Examples of the method include bar coater coating, spin coating, spray coating, curtain coating, dip coating, air knife coating, blade coating and roll coating.

[Support]

A support for use in the lithographic printing plate precursor according to the invention is not particularly restricted as long as it is a dimensionally stable plate-like hydrophilic support. Particularly, an aluminum plate is preferred. In advance of the use of an aluminum plate, the aluminum plate is preferably subjected to a surface treatment, for example, roughening treatment or anodizing treatment. The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively). With respect to the surface treatments, methods described in Paragraph Nos. [0241] to [0245] of JP-2007-206217 are preferably used.

The center line average roughness of the support is preferably from 0.10 to 1.2 μm. In the range described above, good adhesion property to the photosensitive layer and good printing durability and good resistance to stain are achieved.

Also, the color density of the support is preferably from 0.15 to 0.65 in terms of the reflection density value. In the range described above, good image-forming property by preventing halation at the image exposure and good aptitude for plate inspection after development are achieved.

The thickness of the support is preferably from 0.1 to 0.6 mm, more preferably from 0.15 to 0.4 mm, and still more preferably from 0.2 to 0.3 mm.

<Hydrophilizing Treatment of Support and Undercoat Layer>

As to the lithographic printing plate precursor according to the invention, in order to increase hydrophilicity of the non-image area and to prevent printing stain, it is preferred to conduct a hydrophilizing treatment of the surface of support or to provide an undercoat layer between the support and the photosensitive layer.

The hydrophilizing treatment of the surface of support includes an alkali metal silicate treatment method wherein the support is subjected to an immersion treatment or an electrolytic treatment in an aqueous solution, for example, of sodium silicate, a method of treating with potassium fluorozirconate and a method of treating with polyvinylphosphonic acid. An immersion treatment method in an aqueous polyvinylphosphonic acid solution is preferably used.

As the undercoat layer, an undercoat layer containing a compound having an acid group, for example, a phosphonic acid group, a phosphoric acid group or a sulfonic acid group is preferably used. It is preferred for the compound to further have a polymerizable group in order to increase the adhesion property to the photosensitive layer. Also, a compound further having a hydrophilicity-imparting group, for example, an ethyleneoxide group is exemplified as a preferred compound.

These compounds may be low molecular weight compounds or polymer compounds. For example, a silane coupling agent having an addition-polymerizable ethylenically unsaturated bond reactive group described in JP-A-10-282679 or a phosphorus-containing compound having an ethylenically unsaturated bond reactive group described in JP-A-2-304441 are preferably exemplified.

As a particularly preferred undercoat layer, undercoat layers containing a low molecular weight compound or polymer compound having a crosslinkable group (preferably an ethylenically unsaturated bond group), a functional group capable of interacting with the surface of support and a hydrophilic group described in JP-A-2005-238816, JP-A-2005-124749, JP-A-2006-239867 and JP-A-2006-215263 are exemplified.

The coating amount (solid content) of the undercoat layer is preferably from 0.1 to 100 mg/m$^2$, and more preferably from 1 to 30 mg/m$^2$.

[Backcoat Layer]

A backcoat layer can be provided on the back surface of the support after subjecting the support to the surface treatment or forming the undercoat layer on the support, if desired.

The backcoat layer preferably includes, for example, a layer comprising an organic polymer compound described in JP-A-5-45885 and a coating layer comprising a metal oxide obtained by hydrolysis and polycondensation of an organic metal compound or inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred from the standpoint that the starting materials are inexpensive and easily available.

[Method for Producing Lithographic Printing Plate]

The method for producing a lithographic printing plate according to the invention is described below. The lithographic printing plate precursor according to the invention is subjected to image exposure and development processing to prepare a lithographic printing plate. After the image exposure, the exposed lithographic printing plate precursor may be subjected to the heat treatment (pre-heat treatment) described below and then subjected to the development processing.

[Image Exposure]

The image exposure is performed by exposing the lithographic printing plate precursor with laser through a transparent original having a line image, a halftone dot image or the like, or imagewise exposing it by scanning of laser beam based on digital data.

The wavelength of the light source is preferably from 300 to 450 nm or from 750 to 1,400 nm. In case of exposing with light of 300 to 450 nm, the lithographic printing plate precursor having an image-recording layer containing a sensitizing dye having an absorption maximum in the wavelength range is used. In case of exposing with light of 750 to 1,400 nm, the lithographic printing plate precursor containing an infrared absorbing agent which is a sensitizing dye having an absorption maximum in the wavelength range is used. As the light source having a wavelength from 300 to 450 nm, a semiconductor laser is preferably used. As the light source having a wavelength from 750 to 1,400 nm, a solid laser or semiconductor laser emitting an infrared ray is preferably used. The exposure mechanism may be any of an internal drum system, an external drum system and a flat bed system.

[Development Processing]

The development processing is performed by treating the image-exposed lithographic printing plate precursor with a developer to remove the unexposed area of the image-recording layer, thereby forming a non-image area. In the method for producing a lithographic printing plate according to the invention, since a protective layer is also removed simultaneously by the development processing, it is not necessary to conduct a water washing treatment (pre-water washing treatment) of the image-exposed lithographic printing plate precursor prior to the development processing.

In order to apply a developer to the image-exposed lithographic printing plate precursor in the development processing step, known methods can be utilized. For instance, a method of immersing the lithographic printing plate precursor in the developer (immersion method), a method of spraying the developer to the lithographic printing plate precursor (spray method), or a method of coating the developer on the lithographic printing plate precursor (coat method) is preferably used. Also, a means for rubbing the surface of the lithographic printing plate precursor, for example, with a brush is added to these methods, if desired. The application of developer to the lithographic printing plate precursor may be conducted in one step or a plurality of steps. As the plurality of steps, two steps or three steps is preferred. In case of conducting the development processing in the plurality of steps, the application method of developer may be the same or different from each other. For example, an immersion method-immersion method or an immersion method-spray method is preferably used. Also, in case of conducting the development processing in the plurality of steps, the composition of the developer used in each of the steps may be the same or different from each other.

One preferred embodiment of the method for producing a lithographic printing plate according to the invention is characterized by not containing a water washing treatment after the development processing. The term "not containing a water washing treatment" as used herein means that any water washing treatment is not contained after the development processing of the lithographic printing plate precursor. Specifically, according to the embodiment, there is an advantage in that the lithographic printing plate can be produced without undergoing any water washing treatment after the image exposure.

In the case where a developer used in the development processing contains a surface protective compound which inhibits contamination or damage of the surface of lithographic printing plate obtained, an oil-desensitizing treatment can be performed simultaneously with the development processing. Such a developer will be described hereinafter.

To perform the development processing in one step using the developer containing a surface protective compound is anther preferred embodiment of the method for producing a lithographic printing plate according to the invention. The embodiment is particularly excellent from the standpoints of simplification of processing steps, consideration for global environment, space saving, low running cost and the like.

The temperature of the developer in the development processing is not particularly restricted and is preferably from 20 to 40° C., more preferably from 20 to 35° C., and particularly preferably from 20 to 30° C.

The development processing is preferably performed by a development device (hereinafter, also referred to as an automatic development processor). The development device which is preferably used in the method for producing a lithographic printing plate according to the invention is described below.

FIG. 1 is a view schematically showing a configuration of a development device which is preferably used in the method for producing a lithographic printing plate according to the invention. The development device is preferably used in the case of conducting the development processing in two steps.

The development device 1 conducts development of a lithographic printing plate precursor 10 which has been previously exposed to light in its image-recording area while transporting the exposed lithographic printing plate precursor 10 along a transport path, thereby producing a lithographic printing plate.

The development device 1 equips a pre-heat unit 150, a first processing unit 2, a second processing unit 3, a third processing unit 4 and a drying unit 152 in this order from the upstream side in the transporting direction of the lithographic printing plate precursor 10 transported.

The pre-heat unit 150 has a heating unit. The pre-heat unit 150 conducts pre-heating of the lithographic printing plate precursor 10 by the heating unit prior to the development processing. The pre-heat is carried out under conditions of 100° C. for 10 seconds. The heating time and heating temperature can be appropriately changed depending on the lithographic printing plate precursor. The heating time is preferably set from 5 to 30 seconds. The heating temperature is preferably set from 60 to 140° C., and more preferably from 80 to 120° C. The pre-heat unit is not necessarily provided and the pre-heat unit may be omitted depending on the configuration of the lithographic printing plate precursor.

The first processing unit 2 has a tank 20. In the tank 20, a specified amount of developer L1 is held. The first processing unit 2 develops the exposed area of the image-recording layer by immersing the lithographic printing plate precursor 10 transported in the developer L1. In the configuration shown in FIG. 1, the first processing unit 2 functions as a first developing unit.

The first processing unit 2 also equips a transport roller pair 22 and a transport roller pair 24. The transport roller pair 22 is disposed on the upstream side of the transport path in the first processing unit 2, and carries the lithographic printing plate precursor 10 transported in the developer L1 held in the tank 20 so as to be immersed. The transport roller pair 24 is disposed on the downstream side of the transport path in the first processing unit 2, and carries the lithographic printing plate precursor 10 out from the first processing unit 2.

The first processing unit 2 equips a rubbing member 26. The rubbing member 26 is disposed between the transport roller pair 22 and the transport roller pair 24 of the transport path in the first processing unit 2. The rubbing member 26 rubs a surface of the lithographic printing plate precursor immersed in the developer L1 held in the tank 20 to remove the protective layer and the unexposed area of the image-recording layer. Since the rubbing member 26 rubs the lithographic printing plate precursor 10 in the state of immersion in the developer L1, scatter of the developer hardly occurs. Thus, contamination in the inside of the development device and generation of the scum caused by the scatter of developer can be avoided.

The rubbing member may be any member capable of rubbing the surface of the lithographic printing plate precursor. In particular, a rotating brush roller capable of rotating around its rotation axis as the center thereof to rub the surface is preferably used. As such a rotating brush roller, for example, a known channel brush, twisted brush, planted brush, carpet brush or Moulton roller can be preferably used.

In the case where the lithographic printing plate precursor is rubbed using, for example, the rotating brush roller in the state of immersion in the processing solution, the rubbing member is immersed in the processing solution preferably to a degree of ⅓ or more of the diameter thereof, more preferably to a degree of ⅔ or more thereof, still more preferably to a degree of ¾ or more thereof, from the standpoint of avoiding the scatter of solution.

As the channel brush, brushes produced by spirally winding a long so-called channel brush (strip brush) around a surface of a roller body as described in JP-UM-A-62-167253, JP-UM-A-4-63447, JP-UM-A-4-64128 and JP-A-6-186751 are used. As the twisted brush, brushes produced by inserting a twisted brush into a spiral groove formed on the surface of a shaft thereby spirally winding it around the shaft as described in JP-A-3-87832 are used. As the planted brush, brushes produced according to a method of planting a brush material in small holes formed in a shaft roller are used. As the carpet brush, brushes produced by winding a long and thin strip of textile woven with wool material around a peripheral surface of a shaft roller as described in JP-A-2001-5193 and JP-A-2001-66788 are used. As the Moulton roller, brushes produced by covering a roller body with a sliding sleeve of a woven fibrous material and firmly tightening the sleeve on the mounted side thereof as described in JP-A-10-198044 are used.

In case where a rotating member is used as the rubbing member, the number of revolution of the rubbing member is preferably as large as possible for improving the removability of the image-recording layer in the unexposed area of the lithographic printing plate precursor. However, from the standpoint of the durability and the production cost of the development device and of prevention of scatter of the processing solution and damage of the exposed area of the lithographic printing plate precursor, it is preferably from 30 to 1,000 rpm, and more preferably from 50 to 500 rpm.

In case of using a brush as the rubbing member, a number of the brushes is at least one, and a plurality of brushes may also be used. In case of using 2 or more brushes, one or more thereof may be rotated in the direction opposite to the processing direction of the lithographic printing plate precursor. Further, in case of using a rotating rubbing member, the development processing may be performed while the rubbing member is rocked in the rotary axis direction. By rocking the rubbing member in the rotary axis direction, removal of the non-image area of the lithographic printing plate precursor may be more effectively performed and a lithographic printing plate having a better quality can be produced.

As a material of the brush used for the rubbing member, natural fibers, for example, horsehair or pig hair, artificial fibers, metal fibers and the like are known. In view of the chemical resistance thereof, artificial fibers are preferred. Examples of the artificial fiber usable include a polyamide, for example, nylon 6, nylon 6·6, nylon 6·10, nylon 6·12 or nylon 12, a polyester, for example, polyethylene terephthalate or polybutylene terephthalate (PBT), a polyacrylic, for example, polyacrylonitrile or alkyl poly(meth)acrylate, a polyolefin, for example, polyethylene, polypropylene, polystyrene, polyvinyl chloride or polyvinylidene chloride, a cellulose, for example, acetyl cellulose, a polyurethane, for example, polyurethane, polyphenylene sulfide and a fluorine resin, for example, an ethylene/tetrafluoroethylene copolymer or polyvinylidene fluoride. Taking the elasticity, rigidity, abrasion resistance, heat resistance, chemical resistance, water absorbability and hygroscopic property thereof into consideration, nylon 6, nylon 6·6, nylon 6·10, nylon 6·12, nylon 12, polypropylene, polybutylene terephthalate and polyethylene terephthalate are preferred, and nylon 6·6, nylon 6·10, nylon 6·12, nylon 12, polybutylene terephthalate (PBT) and polypropylene are more preferred. Of the polyesters, polybutylene terephthalate (PBT) is particularly preferred. Of the polyolefins, polypropylene is particularly preferred.

A size of the bristle of the brush is not particularly restricted and is preferably from 0.01 to 1.0 mm, and more preferably from 0.1 to 0.5 mm. When the size of the bristle of the brush is smaller than 0.01 mm, the rubbing property may become poor and when it is larger than 1.0 mm, rubbing scratches may be formed on the surface of the plate. A length of the bristle of the brush is also not particularly restricted and is ordinarily in a range from 3 to 50 mm. When the length is shorter than 3 mm, the touch of the brush to the lithographic printing plate precursor may become uneven to be apt to form rubbing scratches on the surface of the plate. When it is longer than 50 mm, it does not give any more advantage of development processing and it is economically disadvantageous. In case of the Moulton roller, since it is covered by a roller body with a sliding sleeve of a woven fibrous material, it is not necessary to define the size and the length of the bristle material thereof.

The second processing unit 3 has a tank 30. In the tank 30, a specified amount of developer L2 is held. In the configuration shown in FIG. 1, the second processing unit 3 functions as a second developing unit.

The second processing unit 3 also equips a transport roller pair 32 and a transport roller pair 34. The transport roller pair 32 is disposed on the upstream side of the transport path in the second processing unit 3, and carries the lithographic printing plate precursor 10 carried out from the first processing unit 2 in the second processing unit 3. The transport roller pair 34 is disposed on the downstream side of the transport path in the second processing unit 3, and carries the lithographic printing plate precursor 10 out from the second processing unit 3. The lithographic printing plate precursor 10 is transported almost horizontally between the transport roller pair 32 and the transport roller pair 34.

The second processing unit 3 further has a pair of spray pipes 31 disposed in parallel each other. The pair of spray pipes 31 is disposed so as to tuck the transport path between the both of the spray pipes. Also, the pair of spray pipes 31 is disposed between the transport roller pair 32 and the transport roller pair 34 in the transport path in the second processing unit 3.

The pair of spray pipes 31 sprays the developer L2 on the lithographic printing plate precursor 10 transported. Thus, the second processing unit 3 makes it possible to develop supplementally the exposed area of the image-recording layer which remains without development in the first processing unit 2 and to wash off the scum adhered on the lithographic printing plate precursor 10. The second processing unit 3 equips a mechanism for feeding the developer L2 held in the tank 30 to the spray pipes 31, and the developer L2 sprayed from the spray pipes 31 returns to the tank 30, thereby conducting circulation.

The third processing unit 4 has a tank 40. In the tank 40, a specified amount of developer L3 is held. In the configuration shown in FIG. 1, the third processing unit 4 functions as a developing unit same as the second developing unit 3.

The third processing unit 4 also equips a transport roller pair 42 and a transport roller pair 44. The transport roller pair 42 is disposed on the upstream side of the transport path in the third processing unit 4, and carries the lithographic printing plate precursor 10 carried out from the second processing unit 3 in the third processing unit 4. The transport roller pair 44 is disposed on the downstream side of the transport path in the third processing unit 4, and carries the lithographic printing plate precursor 10 out from the third processing unit 4. The lithographic printing plate precursor 10 is transported almost horizontally between the transport roller pair 42 and the transport roller pair 44.

The third processing unit 4 further has a pair of spray pipes 41 disposed in parallel each other. The pair of spray pipes 41 is disposed so as to tuck the transport path between the both of the spray pipes. Also, the pair of spray pipes 41 is disposed between the transport roller pair 42 and the transport roller pair 44 in the transport path in the third processing unit 4.

The pair of spray pipes 41 sprays the developer L3 on the lithographic printing plate precursor 10 transported. Thus, the third processing unit 4 makes it possible to develop supplementally the exposed area of the image-recording layer which remains without development in the first processing unit 2 and the second processing unit 3 and to wash off the scum adhered on the lithographic printing plate precursor 10. The third processing unit 4 equips a mechanism for feeding the developer L3 held in the tank 40 to the spray pipes 41, and the developer L3 sprayed from the spray pipes 41 returns to the tank 40, thereby conducting circulation.

The drying unit 152 dries the lithographic printing plate precursor 10 carried out from the third processing unit 4. The drying temperature (temperature on the surface of the lithographic printing plate precursor) is about 55° C., and is preferably set in a range from 50 to 60° C. The temperature can be appropriately set depending on the configuration of the lithographic printing plate precursor and the formulation of the developer.

The development device 1 also equips a replenishment unit 60 and a liquid feeding apparatus.

The replenishment unit 60 replenishes a fresh developer to the tank 30 of the second processing unit 3 through a pipe or the like. The fresh developer means an unused developer which is not used for processing the lithographic printing plate precursor and is preferably an unused developer L2.

The liquid feeding apparatus feeds a developer in an amount corresponding to the state of the developer L1 held in the tank 20 of the first processing unit 2 from the tank 30 of the second processing unit 3 to the tank 20. The liquid feeding apparatus equips a pipe 80, a recovery unit 82, a tank 84 and a pump 86.

The pipe 80 is extended between the tank 20 and the tank 30, and is a closed path for running the developer L2 fed.

The recovery unit 82 recovers the developer L2 in an amount corresponding to the amount overflowed from a recovery aperture to introduce into the pipe 80, when the developer L2 held in the tank 30 exceeds a definite liquid surface level.

The tank 84 is connected to the recovery unit 82 through the pipe 80. The tank 84 temporarily retains the developer L2 recovered by the recovery unit 82.

The pump 86 is connected to the tank 84 through the pipe 80. The pump 86 feeds the developer L2 retained in the tank 84 to the tank 20 of the first processing unit 2 through the pipe 80. The pump 86 feeds the developer L2 to the tank 20 in a feed amount corresponding to a rotation number by controlling the rotation number of a driving motor. The pump 86 is, for example, a pump capable of supplying a predetermined volume of the developer, and a bellows pump, a diaphragm pump, a piston pup, a plunger pump or the like is adopted.

Also, in the liquid feeding apparatus, a filter unit for removing a foreign substance, for example, scum included in the developer L2 may be provided in the pipe. Thus, the scum or the like is removed from the developer and the developer can be constantly maintained in the clean state. Further, the recovery unit 82 and the tank 84 may be integrally provided.

The development device 1 can replenishes a fresh developer L2 to the tank 30 of the second processing unit 3 by the replenishment unit 60. Thus, deterioration of the state of the developer L2 held in the tank 30 can be prevented.

Also, the development device 1 replenishes the developer L2 from tank 30 to tank 20 by the liquid feeding apparatus depending on the state of the developer held in the first tank. The state of the developer held in the first tank means a height of liquid surface (level of liquid) of the developer L1 and a fatigue degree of the developer L1.

The developer L1, the developer L2 and the developer L3 may have the same composition or different compositions as long as the effect of the invention is not impaired. It is preferred that the developer L1 is same as the developer L2. In this case, the development device 1 controls an amount of the developer L2 fed to the tank 20 by the liquid feeding apparatus so as not to change and to stabilize the component of the developer L1 held in the tank 20 of the first processing unit 2. The temperatures of the developers L1 and L2 are appropriately set respectively and are preferably from 10 to 50° C.

Also, in order to restore the development property of the developer L1 held in the tank 20, a concentrated solution may be used as the developer L2 which is replenished to the tank 30 of the second processing unit 3. The replenishment of the concentrated solution is carried out in a case where the tank 84 is shielded and an evaporation amount is small. The replenishment amount in the case is preferably from 1.05 to 6 times, more preferably from 1.1 to 3 times, and still more preferably from 1.1 to 2 times. On the other hand, there is a case where the developer L2 is apt to contact with the outside air and evaporation amount is large. In this case, a solution for replenishment may be formed by dilution. In this case, a dilution rate is preferably from 0.6 to 0.95 times, more preferably from 0.7 to 0.9 times, and still more preferably from 0.8 to 0.9 times.

The liquid feeding amount from the tank 30 to the tank 20 is preferably controlled to one L/min or below, in order to prevent the uniformity of temperature is locally impaired, when the liquid feeding amount is increased.

The tank 30 maintains the uniformity of the developer L1 by means of conducting circulation of the developer L1 held by equipping a spray for circulating solution (not shown) to the tank 30 and using a circulation pump (not shown).

The development device 1 has a liquid feeding system in which an amount of the developer corresponding to the amount increased by the replenishment by the replenishment unit 60 is recovered by the recovery unit 82, held in the tank 84 and then fed. However, the liquid feeding method is not limited thereto. An amount of developer which is preliminarily set in prospect of change in the state of the developer L1 held in the tank 20 may be fed.

According to the development device 1, deterioration of the developer L2 held in the tank 30 can be prevented by performing the replenishment to the second processing unit 3 by the replenishment unit 60. Also, the developer L2 can be fed from the tank 30 to the tank 20 by the liquid feeding apparatus. Therefore, it is not necessary to provide a mechanism for replenishing the developer to the tank 20, only a predetermined amount in accordance with the state of the developer L1 can be fed to the tank 20, and an amount of liquid feeding can be accurately controlled by the pump 86. Thus, the state of the developer can be maintained to produce stably a lithographic printing plate of a high quality.

Also, since the development device 1 feeds the developer L2 to the tank 20 through the pipe 80 which is a closed path, it can prevent the developer L2 fed from being altered upon influence, for example, evaporation. In the configuration where the developer held in the tank is allowed to overflow and the developer is supplied to the tank, it is impossible to control the amount of the developer fed and the alteration of the developer is noticeable.

Further, the development device 1 is capable of performing the liquid feeding even when other processing unit is present between the first processing unit 2 and the second processing unit 3.

The configuration of the development device 1 described above is capable of being appropriately changed.

For example, although the second processing unit and the third processing unit are formed by the horizontal transport system, the effect can be exhibited by an immersion system.

For example, although the development device has the configuration provided with three tanks 20, 30 and 40, it is not limited thereto. The development device may be provided with four or more tanks.

In the development device, any of a system in which a developer held in a tank is pumped up and sprayed from a nozzle to process and a so-called disposable processing system wherein only a necessary amount of a processing solution substantially not used is supplied to each plate to conduct development can be ordinarily used. From the standpoint of avoiding the scatter of solution, a system in which the lithographic printing plate precursor is subjected to the development processing with immersion transport is excellent.

The development device may further be provided integrally with an exposure device.

Another example of the automatic development processor for use in the method for producing a lithographic printing plate according to the invention is described with reference to FIG. 2.

Figure 2:
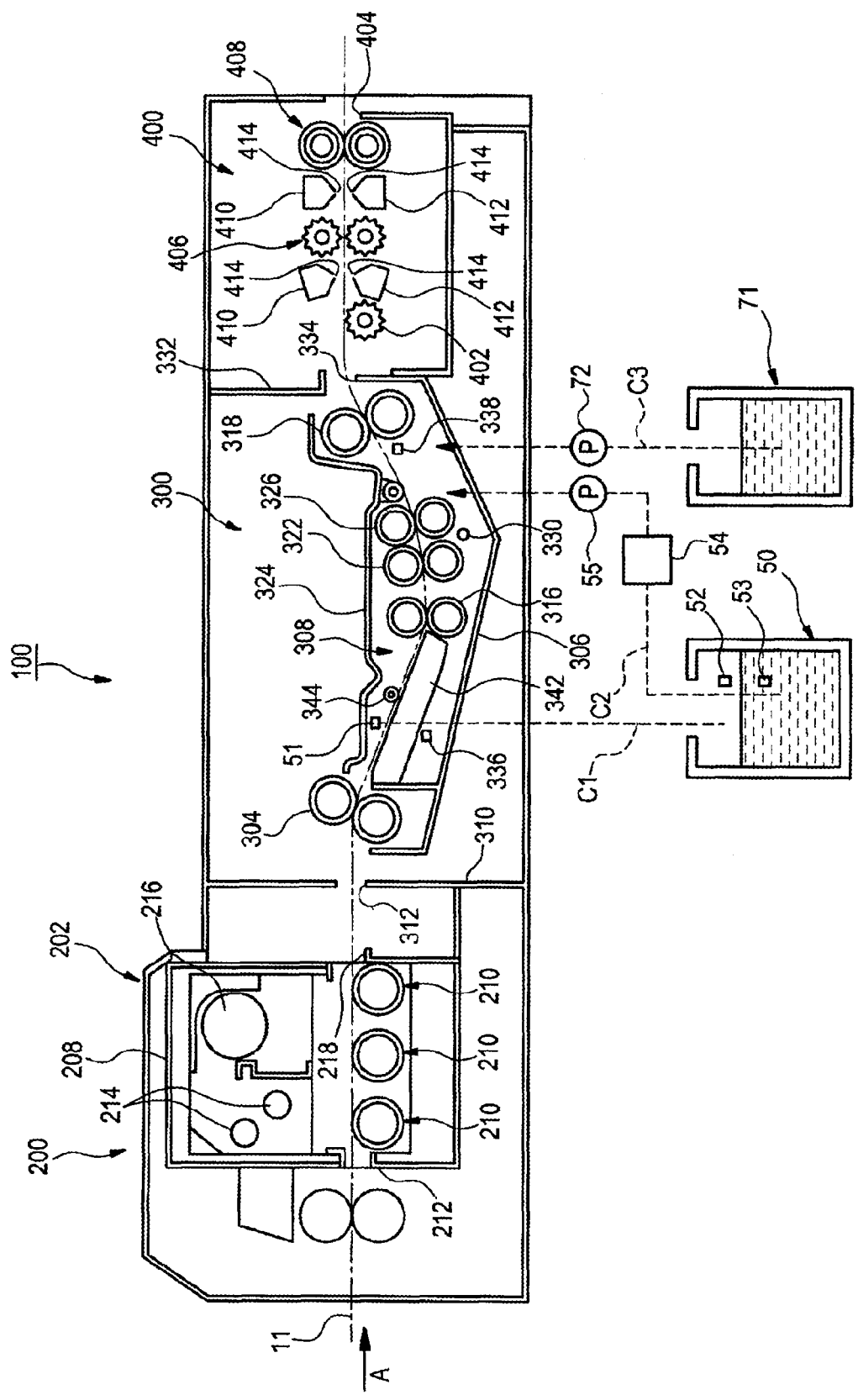
FIG. 2 is a schematic view showing another configuration example of a development device for the lithographic printing plate precursor according to the invention.

FIG. 2 is a view schematically showing the configuration of another automatic development processor preferably used in the method for producing a lithographic printing plate according to the invention. The automatic development processor is preferably used in the case of conducting the development processing in one step.

An automatic development processor 100 shown in FIG. 2 comprises a chamber the outer shape of which is formed by a machine casing 202 and has a pre-heating (pre-heat) unit 200, a developing unit 300 and a drying unit 400 continuously formed along a transporting direction (arrow A) of a transporting pass 11 for a lithographic printing plate precursor.

The pre-heating unit 200 comprises a heating chamber 208 having a transporting inlet 212 and a transporting outlet 218 and a skewer roller 210, a heater 214 and a circulation fan 216 are arranged in the inside thereof.

The developing unit 300 is separated from the pre-heating unit 200 by an outer panel 310 and a slit type insertion slot 312 is formed in the outer panel 310.

In the inside of the developing unit 300, a processing tank 306 having a developing tank 308 filled with a developer and an insertion roller pair 304 for guiding the lithographic printing plate precursor into the inside of the processing tank 306 are disposed. A shielding cover 324 is located above the developing tank 308.

In the inside of the developing tank 308, a guide roller 344 and a guide member 342, a submerged roller pair 316, a brush roller pair 322, a brush roller pair 326 and a carrying-out roller pair 318 are provided in order from the upstream side of the transporting direction of lithographic printing plate precursor. The lithographic printing plate precursor transported into the developing tank 308 is immersed in the developer and the non-image area is removed by passing between the rotating brush roller pairs 322 and 326.

A spray pipe 330 is provided under the brush roller pairs 322 and 326. The spray pipe 330 is connected to a pump (not shown) and the developer in the developing tank 308 sucked by the pump is ejected from the spray pipe 330 in the developing tank 308.

On a sidewall of the developing tank 308, an overflow aperture 51 is provided to form a top edge of a first circulation pipeline C1. The excess developer flows in the overflow aperture 51, passes through the first circulation pipeline C1 and is discharged in an external tank 50 provided outside the developing unit 300.

To the external tank 50 is connected a second circulation pipeline C2 and a filter unit 54 and a developer supply pump 55 are located in the second circulation pipeline C2. The developer is supplied from external tank 50 to the developing tank 308 by the developer supply pump 55. In the external tank 50, an upper limit liquid level meter 52 and a lower limit liquid level meter 53 are provided.

The developing tank 308 is also connected to a water tank for replenishment 71 through a third circulation pipeline C3. A water-replenishing pump 72 is located in the third circulation pipeline C3 and water pooled in the water tank for replenishment 71 is supplied to the developing bath 308 by the water-replenishing pump 72.

A liquid temperature sensor 336 is provided on the upstream side of the submerged roller pair 316. A liquid level meter 338 is provided on the upstream side of the carrying-out roller pair 318.

In a partition board 332 placed between the developing unit 300 and the drying unit 400, a slit type pass-through slot 334 is formed. Also, a shutter (not shown) is provided along a passage between the developing unit 300 and the drying unit 400 and the passage is closed by the shutter when the lithographic printing plate precursor 11 does not pass through the passage.

In the drying unit 400, a support roller 402, ducts 410 and 412, a transport roller pair 406, ducts 410 and 412 and a transport roller pair 408 are disposed in this order. A slit hole 414 is provided at the top of each of the ducts 410 and 412. In the drying unit 400, a drying means (not shown), for example, a hot air supplying means or a heat generating means, is also provided. The drying unit 400 has a discharge slot 404 and the resulting lithographic printing plate dried by the drying means is discharged through the discharge slot 404.

Next, the developer will be described. In order to enable to perform an oil-desensitizing treatment simultaneously with the development, a developer having the composition shown below can be preferably used. In particular, a developer containing at least any of a surfactant and a water-soluble polymer compound described hereinafter is preferred in view of imparting the oil-desensitizing treatment ability.

The developer for use in the method for producing a lithographic printing plate according to the invention is preferably an aqueous solution containing water as the main component (containing 60% by weight or more of water). The pH of the developer is preferably from 2.0 to 10.0, more preferably from 5.0 to 10.0, still more preferably from 6.0 to 10.0, and most preferably from 6.5 to 9.9.

The developer may contain an alkali agent. When the developer contains the alkali agent, the pH thereof is preferably in a range from 8.0 to 10.0, more preferably from 9.0 to 10.0, and still more preferably from 9.2 to 9.9. When the developer does not contain the alkali agent, the pH thereof is preferably in a range from 2.0 to 9.0, more preferably from 4.0 to 8.0, and still more preferably from 4.5 to 7.5.

The developer for use in the invention preferably contains a surfactant. The surfactant used includes, for example, anionic, cationic, nonionic or amphoteric surfactant.

The anionic surfactant described above is not particularly restricted and includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkyldiphenylether (di)sulfonic acid salts, alkylphenoxy polyoxyethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, alkylbenzenesulfonic acid salts, alkylnaphthalenesulfonic acid salts and alkyldiphenylether (di)sulfonic acid salts are particularly preferably used.

The cationic surfactant described above is not particularly restricted and includes, for example, alkylamine salts, quaternary ammonium salts, polyoxyethylene alkyl amine salts and polyethylene polyamine derivatives.

The nonionic surfactant described above is not particularly restricted and includes, for example, polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide addacts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Of the compounds, those having an alkylene oxide chain are preferred, those having an aromatic ring and an ethylene oxide chain are more preferred, and alkyl-substituted or unsubstituted phenol ethylene oxide adducts and alkyl-substituted or unsubstituted naphthol ethylene oxide adducts are still more preferred.

As the nonionic surfactant having an alkylene oxide chain, a nonionic aromatic ether surfactant represented by formula (3) shown below is particularly preferably exemplified.

In formula (3), X represents an aromatic group, Y represents single bond or an alkylene group having from 1 to 10 carbon atoms, A and B, which are different from each other, each represents —CH$_2$CH$_2$O— or —CH$_2$CH(CH$_3$)O—, and n and m each represents an integer from 0 to 100, provided that a sum of n and m is 2 or more.

In formula (3), the aromatic group represented by X includes a phenyl group, a naphthyl group or an anthryl group. The aromatic group may have a substituent. The substituent includes an organic group having from 1 to 100 carbon atoms. Examples of the organic group are same as examples of the organic group described for formulae (3-A) and (3-B) shown below. In formula (3), when both A and B are present, they may be present at random or as a block.

The sum of n and m is preferably from 4 to 100, more preferably from 6 to 50, still more preferably from 8 to 30, and particularly preferably from 10 to 28.

Of the nonionic aromatic ether surfactants represented by formula (3), compounds represented by formula (3-A) or (3-B) shown below are preferred.

N-alkylacylamino group, an N-arylacylamino group, an acyl group, an alkoxycarbonylamino group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, a polyoxyalkylene chain, and the above-described organic groups to which a polyoxyalkylene chain is connected. The alkyl group described above may be a straight-chain or branched alkyl group.

Preferred examples of R$_{10}$ or R$_{20}$ include a hydrogen atom, a straight-chain or branched alkyl group having from 1 to 10 carbon atoms, an alkoxy group having from 1 to 10 carbon atoms, an alkoxycarbonyl group, an N-alkylamino group, an N,N-dialkylamino group, an N-alkylcarbamoyl group, an acyloxy group, an acylamino group, a polyoxyalkylene chain having a repeating unit number from about 5 to about 20, an aryl group having from 6 to 20 carbon atoms and an aryl group having a polyoxyalkylene chain having a repeating unit number from about 5 to about 20.

In the compounds represented by formula (3-A) or (3-B), a repeating unit number of the polyoxyethylene chain is preferably from 3 to 50, and more preferably from 5 to 30. A repeating unit number of the polyoxypropylene chain is preferably from 0 to 10, and more preferably from 0 to 5. The

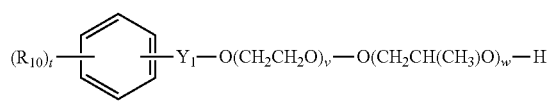

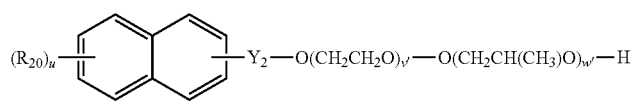

In formulae (3-A) and (3-B), R$_{10}$ and R$_{20}$ each represents a hydrogen atom or an organic group having from 1 to 100 carbon atoms, t and u each represents 1 or 2, Y$_1$ and Y$_2$ each represents a single bond or an alkylene group having from 1 to 10 carbon atoms, v and w each represents an integer from 0 to 100, provided that a sum of v and w is 2 or more, and v' and w' each represents an integer from 0 to 100, provided that a sum of v' and w' is 2 or more.

When t is 2 and R$_{10}$ represents an organic group having from 1 to 100 carbon atoms, two R$_{10}$ may be the same or different, or may be combined with each other to from a ring. Also, when u is 2 and R$_{20}$ represents an organic group having from 1 to 100 carbon atoms, two R$_{20}$ may be the same or different, or may be combined with each other to from a ring.

Specific examples of the organic group having from 1 to 100 carbon atoms include a saturated or unsaturated, straight-chain or branched aliphatic hydrocarbon group or an aromatic hydrocarbon group (for example, an alkyl group, an alkenyl group, an alkynyl group, an aryl group or an aralkyl group), an alkoxy group, an aryloxy group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an acylamino group, an polyoxyethylene part and polyoxypropylene part may be present at random or as a block.

Specific examples of the nonionic aromatic ether surfactant represented by formula (3) are set forth below, but the invention should not be construed as being limited thereto.

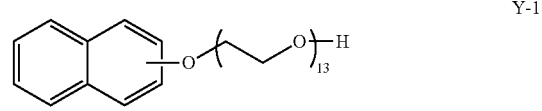

Y-1

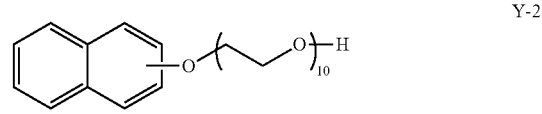

Y-2

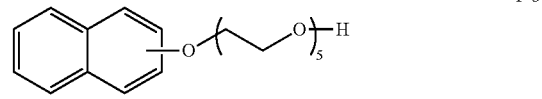

Y-3

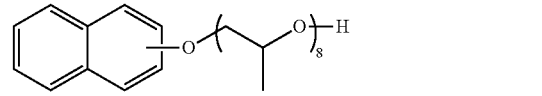

Y-4

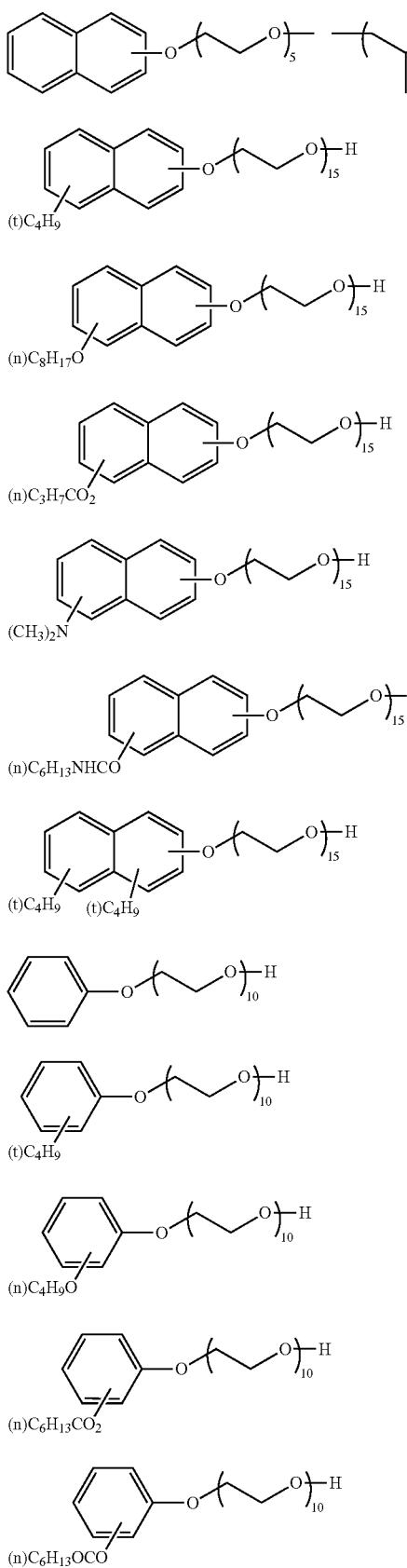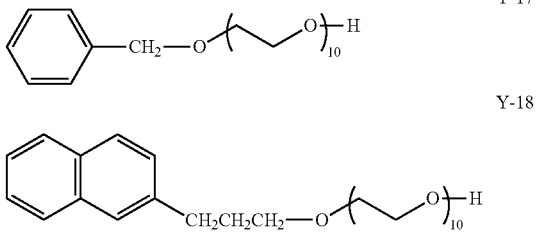

The amphoteric surfactant described above is not particularly restricted and includes, for example, an amine oxide type, for example, an alkyldimethylamine oxide, a betaine type, for example, an alkyl betaine, and an amino acid type, for example, sodium salt of alkylamino fatty acid.

In particular, an alkyldimethylamine oxide which may have a substituent, an alkyl carboxyl betaine which may have a substituent and an alkyl sulfo betaine which may have a substituent are preferably used. Specific examples thereof include compounds described, for example, in Paragraph Nos. [0255] to [0278] of JP-A-2008-203359 and Paragraph Nos. [0028] to [0052] of JP-A-2008-276166.

As the amphoteric surfactant used in the developer, a compound represented by formula (1) shown below or a compound represented by formula (2) shown below is preferred.

$$R^1 - \overset{R^2}{\underset{R^3}{N^+}} - R^4 - COO^- \quad (1)$$

$$R^{11} - \overset{R^{12}}{\underset{R^{13}}{N^+}} - R^{14} - O^- \quad (2)$$

In formulae (1) and (2), $R^1$ and $R^{11}$ each independently represents an alkyl group having from 8 to 20 carbon atoms or an alkyl group having from 8 to 20 carbon atoms in total and a connecting group.

$R^2$, $R^3$, $R^{12}$ and $R^{13}$ each independently represents a hydrogen atom, an alkyl group or a group containing an ethyleneoxide group.

$R^4$ and $R^{14}$ each independently represents a single bond or an alkylene group.

Also, two groups represented by $R^1$, $R^2$, $R^3$ and $R^4$ may be combined with each other to form a ring structure, and two groups represented by $R^{11}$, $R^{12}$, $R^{13}$ and $R^{14}$ may be combined with each other to form a ring structure.

In the compound represented by formula (1) or the compound represented by formula (2), as the total number of carbon atoms increases, the hydrophobic portion becomes larger and solubility of the compound in the aqueous developer decreases. In such a case, the solubility is improved by mixing with water, as a dissolution auxiliary agent, an organic solvent for assisting the dissolution, for example, an alcohol. However, when the total number of carbon atoms excessively increases, the surfactant cannot be dissolved in the proper amount in some cases. Therefore, the sum of carbon atoms in $R^1$ to $R^4$ or $R^{11}$ to $R^{14}$ is preferably from 10 to 40, and more preferably from 12 to 30.

The alkyl group having a connecting group represented by $R^1$ or $R^{11}$ indicates a structure having a connecting group in the alkyl group. Specifically, when the connecting group is one, the alkyl group is represented by "-alkylene group-connecting group-alkyl group". The connecting group includes an ester bond, a carbonyl bond and an amido bond. Although the connecting groups may present two or more, one connecting group is preferred and an amido bond is particularly preferred. The total number of carbon atoms in the alkylene group bonding to the connecting group is preferably from 1 to 5. Although the alkylene group may be straight-chain or branched, it is preferably a straight-chain alkylene group. The alkyl group bonding to the connecting group preferably has from 3 to 19 carbon atoms and although it may be straight-chain or branched, it is preferably a straight-chain alkyl group.

When $R^2$ or $R^{12}$ represents an alkyl group, the total number of carbon atoms is preferably from 1 to 5, and particularly preferably from 1 to 3. Although the alkyl group may be straight-chain or branched, it is preferably a straight-chain alkyl group.

When $R^3$ or $R^{13}$ represents an alkyl group, the total number of carbon atoms is preferably from 1 to 5, and particularly preferably from 1 to 3. Although the alkyl group may be straight-chain or branched, it is preferably a straight-chain alkyl group.

The group containing an ethyleneoxide group represented by $R^3$ or $R^{13}$ includes a group represented by —Ra(CH$_2$CH$_2$O)$_n$Rb, wherein Ra represents a single bond, an oxygen atom or a divalent organic group (preferably having 10 or less carbon atoms), Rb represents a hydrogen atom or an organic group (preferably having 10 or less carbon atoms), and n represents an integer from 1 to 10.

When $R^4$ or $R^{14}$ represents an alkylene group, the total number of carbon atoms is preferably from 1 to 5, and particularly preferably from 1 to 3. Although the alkylene group may be straight-chain or branched, it is preferably a straight-chain alkylene group.

The compound represented by formula (1) or the compound represented by formula (2) preferably has an amido bond and more preferably has an amido bond as the connecting group in $R^1$ or $R^{11}$.

Representative examples of the compound represented by formula (1) or the compound represented by formula (2) are set forth below, but the invention should not be construed as being limited thereto.

I-a)

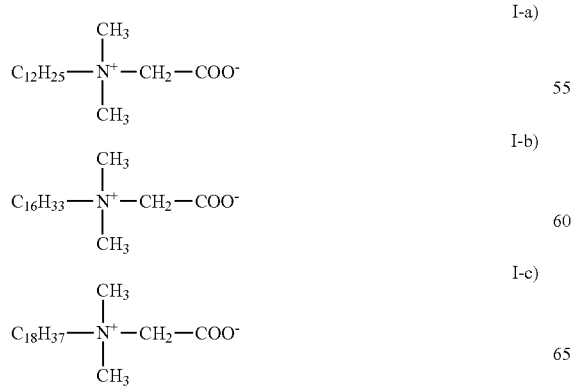

I-b)

I-c)

I-d)

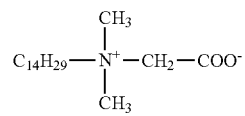

I-e)

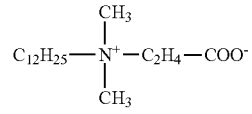

I-f)

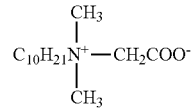

I-g)

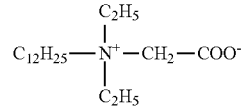

I-h)

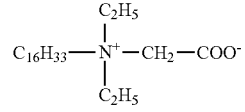

I-i)

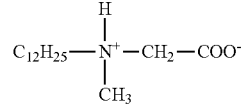

I-j)

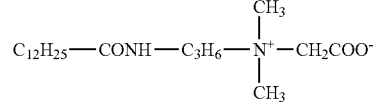

I-k)

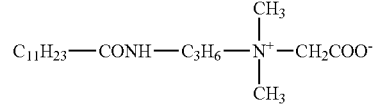

I-l)

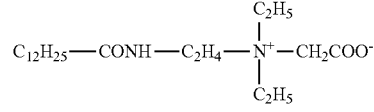

I-m)

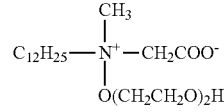

I-n)

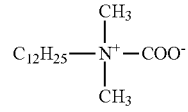

I-o)

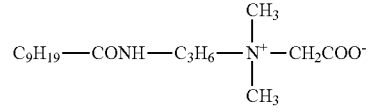

I-p)

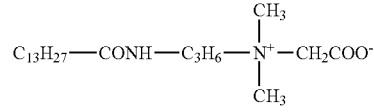

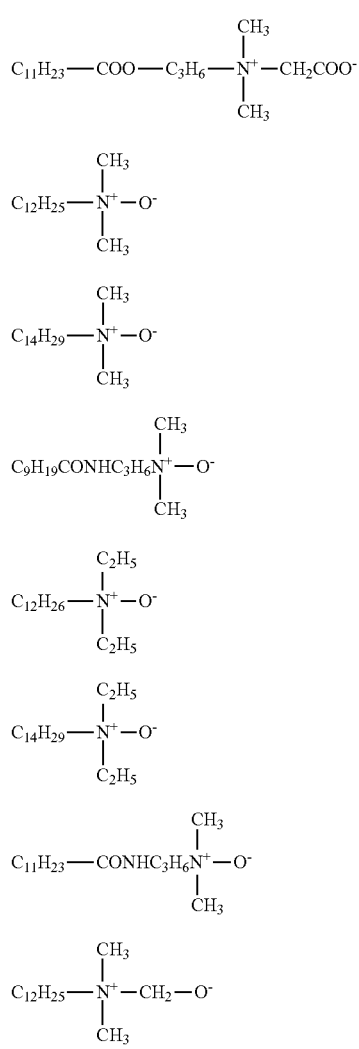

The compound represented by formula (1) or (2) can be synthesized according to a known method. Also, it is possible to use a commercial product. As the commercial product for the compound represented by formula (1), for example, SOFTAZOLINE LPB, SOFTAZOLINE LPB-R or VISTA MAP produced by Kawaken Fine Chemicals Co., Ltd. and TAKESURF C-157L produced by Takemoto Oil & Fat Co., Ltd. are exemplified. As the commercial product for the compound represented by formula (2), for example, SOFTAZOLINE LAO produced by Kawaken Fine Chemicals Co, Ltd. and AMOGEN AOL produced by Dai-Ichi Kogyo Seiyaku Co., Ltd. are exemplified.

Two or more kinds of the surfactants may be used. In the combination of two or more kinds of the surfactants, it is preferred that at least one of the surfactants is a nonionic surfactant. A combination of a nonionic surfactant and a nonionic surfactant or a combination of an amphoteric surfactant and a nonionic surfactant is more preferred.

The content of the surfactant in the developer is preferably from 0.01 to 20% by weight, and more preferably from 0.1 to 10% by weight.

Into the developer according to the invention it is also preferred to incorporate a water-soluble polymer compound having a film-forming property for the purpose of assisting oil-desensitization of the non-image area and plate surface protecting property.

As the water-soluble polymer compound, for example, gum arabic, a cellulose derivative (for example, carboxymethyl cellulose, carboxyethyl cellulose, methyl cellulose, hydroxypropyl cellulose or methyl propyl cellulose) or a modified product thereof, polyvinyl alcohol or a derivative thereof, polyvinyl pyrrolidone, polyacrylamide, a vinyl methyl ether/maleic anhydride copolymer, a vinyl acetate/maleic anhydride copolymer, a styrene/maleic anhydride copolymer, a starch derivative (for example, dextrin, maltodextrin, enzyme-decomposed dextrin, hydroxypropylated starch, hydroxypropylated starch enzyme-decomposed dextrin, carboxymethylated starch, phosphorylated starch or cyclodextrin), and pullulan or a derivative thereof are exemplified.

As other starch derivative which can be used as the water-soluble polymer compound, for instance, roast starch, for example, British gum, an enzymatically modified dextrin, for example, enzyme dextrin or Shardinger dextrin, oxidized starch, for example, solubilized starch, alphalized starch, for example, modified alphalized starch or unmodified alphalized starch, esterified starch, for example, starch phosphate, starch of fatty acid, starch sulfate, starch nitrate, starch xanthate or starch carbamate, etherified starch, for example, carboxyalkyl starch, hydroxyalkyl starch, sulfoalkyl starch, cyanoethyl starch, allyl starch, benzyl starch, carbamylethyl starch or dialkylamino starch, crosslinked starch, for example, methylol crosslinked starch, hydroxyalkyl crosslinked starch, phosphoric acid crosslinked starch or dicarboxylic acid crosslinked starch, and starch graft polymer, for example, starch-polyacrylamide copolymer, starch-polyacrylic acid copolymer, starch-polyvinyl acetate copolymer, starch-polyacrylonitrile copolymer, cationic starch-polyacrylate copolymer, cationic starch-vinyl polymer copolymer, starch-polystyrene-maleic acid copolymer, starch-polyethylene oxide copolymer or starch-polypropylene copolymer are exemplified.

A natural polymer compound which can be used as the water-soluble polymer compound includes, for example, a water-soluble soybean polysaccharide, a starch, for example, starch, gelatin, hemicellulose extracted from soybean, sweet potato starch, potato starch, tapioca starch, wheat starch or corn starch, a polymer obtained from seaweed, for example, carrageenan, laminarin, seaweed mannan, funori, Irish moss, agar or sodium alginate, plant mucilage, for example, of tororoaoi, mannan, quince seed, pectin, tragacanth gum, karaya gum, xanthine gum, guar bean gum, locust bean gum, carob gum or benzoin gum, bacteria mucilage, for example, of homopolysaccharide, e.g., dextran, glucan or levan or of heteropolysaccharide, e.g., succinoglucan or xanthan gum, and protein, for example, glue, gelatin, casein or collagen.

Among them, for instance, gum arabic, a starch derivative, for example, dextrin or hydroxypropyl starch, carboxymethyl cellulose or soybean polysaccharide can be preferably used.

The content of the water-soluble polymer compound in the developer is preferably from 0.05 to 15% by weight, and more preferably from 0.5 to 10% by weight.

The developer for use in the invention preferably further contains a pH buffer agent.

As the pH buffer agent used in the invention, a buffer agent exhibiting a buffer function in a pH range from 2.0 to 10.0 is preferably used and a pH buffer agent functioning in a weak alkaline range is more preferably used. Specifically, for example, (a) a carbonate ion and a hydrogen carbonate ion, (b) a borate ion, (c) an organic amine compound and an ion of the organic amine compound, and combinations thereof are exemplified. Specifically, for example, (a) a combination of a carbonate ion and a hydrogen carbonate ion, (b) a borate ion, or (c) a combination of an organic amine compound and an ion of the organic amine compound exhibits a pH buffer function in the developer to prevent fluctuation of the pH even when the developer is used for a long period of time. As a result, for example, the deterioration of development property resulting from the fluctuation of pH and the occurrence of development scum are restrained. The combination (a) of a carbonate ion and a hydrogen carbonate ion or the combination (c) of an organic amine compound and an ion of the organic amine compound is particularly preferred.

In order for a carbonate ion and a hydrogen carbonate ion to be present in the developer, a carbonate and a hydrogen carbonate may be added to the developer or a carbonate ion and a hydrogen carbonate ion may be generated by adding a carbonate or a hydrogen carbonate to the developer and then adjusting the pH. The carbonate or hydrogen carbonate used is not particularly restricted and it is preferably an alkali metal salt thereof. Examples of the alkali metal include lithium, sodium and potassium and sodium is particularly preferred. The alkali metals may be used individually or in combination of two or more thereof.

When the combination (a) of a carbonate ion and a hydrogen carbonate ion is adopted as the pH buffer agent, the total amount of the carbonate ion and hydrogen carbonate ion is preferably from 0.05 to 5 mole/l, more preferably from 0.1 to 2 mole/l, particularly preferably from 0.2 to 1 mole/l, in the developer. When the total amount is 0.05 mole/l or more, the development property and processing ability are hardly degraded. When the total amount is 5 mole/l or less, precipitates and crystals hardly generate and since gelation at neutralization of waste liquid of the developer hardly occur, treatment of the waste liquid can be carried out without trouble.

When (b) a borate ion is adopted as the pH buffer agent, the total amount of the borate ion is preferably from 0.05 to 5 mole/l, more preferably from 0.1 to 2 mole/l, particularly preferably from 0.2 to 1 mole/l, in the developer. When the amount of the borate is 0.05 mole/l or more, the development property and processing ability are hardly degraded. When the amount of the borate is 5 mole/l or less, precipitates and crystals hardly generate and since gelation at neutralization of waste liquid of the developer hardly occur, treatment of the waste liquid can be carried out without trouble.

According to the invention, a combination of a water-soluble amine compound and an ion of the amine compound is also preferably used. The water-soluble amine compound is not particularly restricted and preferably a water-soluble amine having a group capable of facilitating water solubility. The group capable of facilitating water solubility includes, for example, a carboxylic acid group, a sulfonic acid group, a sulfinic acid group, a phosphonic acid group and a hydroxy group. The water-soluble amine compound may have two or more groups capable of facilitating water solubility. Further, the carboxylic acid group, sulfonic acid group, sulfinic acid group or phosphonic acid group may form a salt structure. Among them, an amine compound having a hydroxy group is particularly preferred.

Specific examples of the water-soluble amine compound having a carboxylic acid group, a sulfonic acid group or a sulfinic acid group include an amino acid, for example, glycine, aminodiacatic acid, lysine, threonine, serine, asparaginic acid, parahydroxyphenyl glycine, dihydroxyethyl glycine, alanine, anthranilic acid or tryptophan, sulfamic acid, cyclohexylsulfamic acid, a fatty acid amine sulfonic acid, for example, taurine, a fatty acid amine sulfinic acid, for example, aminoethanesulfinic acid, and a sodium salt, potassium salt or ammonium salt thereof. Among them, glycine, aminodiacetic acid and the salts thereof are preferred.

Specific examples of the water-soluble amine compound having a phosphonic acid group (including a phosphinic acid group) include 2-aminoethylphosphonic acid, 1-aminoethane-1,1-diphosphonic acid, 1-amino-1-phenylmethane-1,1-diphosphonic acid, 1-dimethylaminoethane-1,1-diphosphonic acid, ethylenediaminopentamethylenephosphonic acid, and a sodium salt, potassium salt or ammonium salt thereof. Among them, 2-aminoethylphosphonic acid or a salt thereof is preferred.

Specific examples of the water-soluble amine compound having a hydroxy group include monoethanol amine, diethanol amine, triethanol amine, N-hydroxyethylmorpholine, monoisopropanol amine, monoisopropanol amine, diisopropanol amine, diisopropanol amine, triisopropanol amine, triisopropanol amine and N,N-diethanolaniline. Among them, monoethanol amine, diethanol amine, triethanol amine or N-hydroxyethylmorpholine is preferred. Of the compounds, a di- or tri-alkanolamine compound which is substituted with an alkyl group having at least one hydroxy group and an ion thereof are particularly preferred. The alkyl group having at least one hydroxy group may further have a substituent selected from a hydroxy group, a halogen atom, a nitro group, a nitrile group, a (hetero)aromatic group and a saturated or unsaturated hydrocarbon group. The alkyl group is preferably that having 15 or less carbon atoms, more preferably that having 12 or less carbon atoms, and still more preferably that having 8 or less carbon atoms.

Specific examples of the alkanol group include HO—$CH_2$—*, HO—$CH_2$—$CH_2$—*, HO—$CH_2$—$CH_2$—$CH_2$—*, $CH_3$—CH(OH)—$CH_2$—*, $CH_3$—C(OH)($CH_3$)—*, HO—$CH_2$—$CH_2$—$CH_2$—$CH_2$—*, $CH_3$—CH($CH_3$)—CH(OH)—*, $CH_3$—CH($C_2H_5$)—CH(OH)—*, $CH_3$—C($CH_3$)(OH)—$CH_2$—*, HO—$CH_2$—$CH_2$—$CH_2$—$CH_2$—$CH_2$—*, HO—$CH_2$—$CH_2$—$CH_2$—CH(OH)—$CH_2$$CH_2$—*, $CH_3$—$CH_2$—CH(OH)—$CH_2$—$CH_2$—$CH_2$—*, $CH_3$—CH($CH_3$)—$CH_2$—CH(OH)—$CH_2$—*, $CH_3$—CH($C_2H_5$)—$CH_2$—CH(OH)—$CH_2$—*, HO—$CH_2$—$CH_2$—$CH_2$—$CH_2$—$CH_2$—$CH_2$—$CH_2$—*, HO—$CH_2$—$CH_2$—$CH_2$—CH(OH)—$CH_2$—$CH_2$—$CH_2$—*, $CH_3$—$CH_2$—CH(OH)—$CH_2$—$CH_2$—$CH_2$—$CH_2$—* and $CH_3$—CH($CH_3$)—$CH_2$—C($C_2H_5$)(OH)—$CH_2$—$CH_2$—$CH_2$—*, wherein * denotes a connecting cite to N of the amine group.

Specific examples of the di- or tri-alkanolamine include triethanolamine, diethanolamine, 2-amino-2-methyl-1,3-propanediol, 2-amino-2-ethyl-1,3-propanediol, trishydroxymethylaminomethane and triisopropanolamine.

The ion of the water-soluble amine compound may be generated in an aqueous solution of the water-soluble amine compound. To the aqueous solution of the water-soluble amine compound may further be added an alkali or an acid. Alternatively, the ion of the water-soluble amine compound may be contained in an aqueous solution by adding a salt of the water-soluble amine compound.

As the alkali, for example, sodium hydroxide, potassium hydroxide, lithium hydroxide, sodium carbonate, potassium carbonate, ammonium carbonate, sodium hydrogen carbonate, potassium hydrogen carbonate, ammonium hydrogen carbonate, or a combination thereof can be used. As the acid, for example, an inorganic acid, for example, hydrochloric acid, sulfuric acid, a nitric acid, phosphoric acid or phosphorous acid can be used, and particularly phosphoric acid or phosphorous acid is preferred. By adding such an alkali or acid, the pH can be finely adjusted.

The developer according to the invention preferably contains a salt composed of a reaction product of an acid and an amine. Thus, an ion of the organic amine compound is generated.

Also, the developer more preferably contains a salt composed of a reaction product of at least any acid of phosphoric acid and phosphorous acid and a di- or tri-alkanolamine.

When the combination (C) of an organic amine compound and an ion of the organic amine compound is used as the pH buffer agent, the amount thereof is preferably from 0.005 to 5 mole/l, more preferably from 0.01 to 2 mole/l, particularly preferably from 0.01 to 1 mole/l, in terms of molar concentration in the developer. When the total amount of the organic amine compound and ion is in the range described above, the development property and processing ability do not degrade and treatment of the waste liquid is easily carried out.

When the pH buffer agent is the salt composed of a reaction product of at least any acid of phosphoric acid and phosphorous acid and a di- or tri-alkanolamine, the amount thereof is preferably at least 0.02 mole/l, more preferably at least 0.1 mole/l, particularly preferably at least 0.15 mole/l, and is preferably 5 mole/l or less, more preferably 2.5 mole/l or less, particularly preferably 1 mole/l or less, in terms of molar concentration in the developer. A substance amount ratio of the amine to the acid is preferably 0.1 or more, more preferably 0.4 or more, most preferably 0.75 or more, and is preferably 20 or less, more preferably 12 or less, still more preferably 5 or less.

The developer according to the invention may contain an organic solvent. As the organic solvent capable of being contained, for instance, an aliphatic hydrocarbon (for example, hexane, heptane, ISOPAR E, ISOPAR H, ISOPAR G (produced by Esso Chemical Co., Ltd.)), an aromatic hydrocarbon (for example, toluene or xylene), a halogenated hydrocarbon (methylene dichloride, ethylene dichloride, trichlene or monochlorobenzene) or a polar solvent is exemplified. Examples of the polar solvent include an alcohol (for example, methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol or methylamyl alcohol), a ketone (for example, acetone, methyl ethyl ketone, ethyl butyl ketone, methyl isobutyl ketone or cyclohexanone), an ester (for example, ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (for example, triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide or N-methylpyrrolidone).

The organic solvent contained in the developer may be used two or more kinds in combination. When the organic solvent is insoluble in water, it may be employed by being solubilized in water using a surfactant or the like. The concentration of the organic solvent is desirably less than 40% by weight, preferably less than 10% by weight, more preferably less than 5% by weight, in view of safety and inflammability.

The developer according to the invention may contain an enzyme. With respect to the enzyme for use in the invention, the kind thereof is not particularly restricted, as long as the enzyme has a function of preventing the occurrence of development scum in the development processing of a lithographic printing plate precursor having a photopolymerizable image-recording layer. The groups of enzymes as described in *Koso Handbook*, Third Edition, edited by Tatsuhiko Yagi et al, Asakura Publishing Co., Ltd. are appropriately used. In particular, for the purpose of decomposition and solubilization of the monomer (ethylenically unsaturated compound), the hydrolytic enzymes belonging to the enzyme number (EC number) of Group EC3. according to the Enzyme Commission of the International Union of Biochemistry and Molecular Biology (IUBMB) are preferably used. Since the ethylenically unsaturated compounds are composed, for example, of a carbon atom, a hydrogen atom, a nitrogen atom, an oxygen atom, a sulfur atom, a phosphorus atom and a halogen atom in many cases, an enzyme capable of hydrolyzing a carboxylic acid ester bond, an enzyme capable of hydrolyzing a phosphoric acid ester, an enzyme capable of hydrolyzing a sulfuric acid ester, an enzyme capable of hydrolyzing an ether bond, an enzyme capable of hydrolyzing a thioether structure, an enzyme capable of hydrolyzing a peptide bond, an enzyme capable of hydrolyzing a carbon-nitrogen bond, an enzyme capable of hydrolyzing a carbon-carbon bond, an enzyme capable of hydrolyzing a carbon-halogen bond and the like are exemplified as preferred enzymes. The enzymes capable of hydrolyzing at least one member selected from the group consisting of an ester bond, an amido bond, a tertiary amino group, a urethane bond, a urea bond, a thiourethane bond and a thiourea bond are more preferred.

Of the enzymes, those belonging to Group EC3.1 (ester hydrolytic enzyme) and Group EC3.4 (peptide bond hydrolytic enzyme) are preferred, and EC3.1.1.3 (triacylglycerol lipase), EC3.4.11.1 (leucyl aminopeptidase), EC3.4.21.62 (subtilisin), EC3.4.21.63 (oryzin), EC3.4.22.2 (papain), EC3.4.22.32 (stem bromelain), EC3.4.23.18 (aspergillopepsin I), EC3.4.24.25 (vibriolysin), EC3.4.24.27 (thermolysis) and EC3.4.24.28 (bacillolysin) are preferred. Further, EC3.1.1.3, EC3.4.21.14, EC3.4.21.62 and EC3.4.21.63 are most preferred.

As described above, the pH of the developer is preferably from 2.0 to 10.0, more preferably from 5.0 to 10.0, still more preferably from 6 to 10.0, and most preferably from 6.9 to 9.9.

From this point of view, as the enzyme, an alkali enzyme is preferably used. The term "alkali enzyme" as used herein means an enzyme which has an optimum pH range in an alkaline range. The enzyme having the optimum pH range from 6.9 to 9.9 is preferred. The enzyme having an optimum temperature range from 20 to 60° C. is preferred, and that having an optimum temperature range from 25 to 50° C. is more preferred.

Specifically, an enzyme capable of mainly hydrolyzing an ester group of the monomer under an alkali condition, for example, alkali protease or alkali lipase is preferred. As the alkali protease, enzymes of microbial origin, for example, *Bacillus subtilis, Aspergillus oryzae, Bacillus stearothermophilus*, papaya latex, papaya, *Ananas comosus* M, Pig pancreas, *Bacillus licheniformis, Aspergillus melleus, Aspergillus* sp., *Bacillus lentus, Bacillus* sp. and *Bacillus clausii* are exemplified. As the alkali lipase, enzymes of microbial origin, for example, *Candida cylindracea, Humicola lanuginosa, Psudomonas, Mucor* sp., *Chromobacterium viscosum, Rhizopus japonics, Aspergillus niger, Mucor javanicus, Penicillium camemberti, Rhizopus oryzae, Candida rugosa, Peni-* cillium roqueforti, Rhizopus delemar, Psendomonas sp., Aspergillus sp., Rhizomucor miehei, Bacillus sp. and Alcaligenes sp. are exemplified.

More specifically, Lipase PL, Lipase QLM, Lipase SL, Lipase MY and Lipase OF (produced by Dai-Nippon Meiji Sugar Co., Ltd.), Newlase F3G, Lipase A "Amano" 6, Lipase AY "Aman" 30G, Lipase G "Amano" 50, Lipase R "Amano", Lipase AS "Amano", Umamizayme G, Papain W-40, Protease A "Amano" G, Protease N "Amano" G, Protease NL "Amano", Protease P "Amano" 3G, Protease S "Amano" G, Bromelain F, Proleather FG-F, Peptidase R, Thermoase PC10F, Protin SD-AC10F, Protin SD-AY10, Protin SD-PC10F, Protin SD-NY10, Spleen digestive enzyme TA, Prozyme, Prozyme 6, Semi-Alkaline Proteinase, Lipase AYS "Amano", Lipase PS "Amano" SD, Lipase AK "Amano", Lipase PS "Amano" IM, Protease N "Amano", Protease S "Amano", Acylase "Aman" and D-Amino acylase "Amano" (produced by Amano Enzyme Inc.), Alcalase, Espelase, Sabinase, Ebalase, Kannase, Lipolase, Lipex, NS44020, NS44120, NS44060, NS44114, NS44126 and NS44160 produced by Novozymes Japan Ltd.), Alkaline protease (produced by Takeda Chemical Industries, Ltd.), Aroase XA-10 (produced by Yakult Pharmaceutical Industry Co., Ltd.), Alkali Protease GL, Protex 6L, Purafect, Purafect OX, Propelase, Protex OXG and Protex 40L (produced by Genencor Kyowa Co., Ltd.), Sumizyme MP (produced by Shin-Nihon Kagaku Kogyo Co., Ltd.), Bioplase OP, Bioplase AL-15KG, Bioplase 30G, Bioplase APL-30. Bioplase XL-416F, Bioplase SP-20FG, Bioplase SP-4FG and Protease CL-15 (produced by Nagase Chemtex Corp.), Orientase (produced by HBI Enzymes Inc.) and Enzylon SA (produced by Rakuto Kasei Industry Co., Ltd.) are exemplified.

With respect to the method for introduction of the enzyme, the enzyme may be directly incorporated into the developer or may be added to the developer at the time of processing of a lithographic printing plate precursor. Also, the development processing may be conducted while supplying the enzyme to the developer.

The content of the enzyme used is preferably from 0.01 to 20% by weight, more preferably from 0.1 to 10% by weight, most preferably from 0.2 to 5% by weight, based on the total amount of the developer.

The developer may contain a preservative, a chelating agent, a defoaming agent, an organic acid, an inorganic acid, an inorganic salt or the like in addition the components described above. Specifically, compounds described in Paragraph Nos. [0266] to [0270] of JP-A-2007-206217 are preferably used.

The developer according to the invention can be used as a developer for the exposed lithographic printing plate precursor and a development replenisher, if desired. The developer can be preferably applied to the automatic development processor described above. In the case of conducting the development processing using the automatic development processor, the developer becomes fatigued in accordance with the processing amount, and hence the processing ability may be restored using a replenisher or a fresh developer.

In the method for producing a lithographic printing plate according to the invention, the lithographic printing plate precursor may be heated its entire surface before the exposure, during the exposure or between the exposure and the development, if desired. By the heating, the image-forming reaction in the image-recording layer is accelerated and advantages, for example, improvement in the sensitivity and printing durability and stabilization of the sensitivity are achieved.

Further, for the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise in that the unexposed area is cured. On the other hand, the heating after the development can be performed using very strong conditions and is ordinarily carried out in a temperature range from 100 to 500° C. When the temperature is too low, a sufficient effect of strengthening the image may not be obtained, whereas when it is excessively high, problems of deterioration of the support and thermal decomposition of the image area may occur.

EXAMPLES

The present invention will be described in detail with reference to the following examples, but the invention should not be construed as being limited thereto. With respect to the polymer descried hereinafter, a ratio of repeating units is indicated as a molar ratio, unless otherwise particularly specified.

Examples 1 to 9 and Comparative Examples 1 to 9

Preparation of Lithographic Printing Plate Precursors 1 to 8

<Preparation of Support 1>

An aluminum plate (material: 1050, refining: H16) having a thickness of 0.24 mm was immersed in an aqueous 5% sodium hydroxide solution maintained at 65° C. to conduct a degreasing treatment for one minute, followed by washing with water. The aluminum plate was immersed in an aqueous 10% hydrochloric acid solution maintained at 25° C. for one minute to neutralize, followed by washing with water. Subsequently, the aluminum plate was subjected to an electrolytic surface-roughening treatment with alternating current under condition of current density of 100 A/dm$^2$ in an aqueous 0.3% by weight hydrochloric acid solution at 25° C. for 60 seconds and then subjected to a desmut treatment in an aqueous 5% sodium hydroxide solution maintained at 60° C. for 10 seconds. The aluminum plate was subjected to an anodizing treatment under conditions of current density of 10 A/dm$^2$ and voltage of 15 V in an aqueous 15% sulfuric acid solution at 25° C. for one minute, then subjected to a hydrophilization treatment by immersing in an aqueous 1% polyvinylphosphonic acid solution at 60° C. for 10 seconds, washing at 20° C. with hard water having calcium ion concentration of 75 ppm for 4 seconds and then with pure water for 4 seconds, and dried, thereby preparing Support 1. The adhesion amount of calcium was 2.0 mg/m$^2$. The surface roughness of Support 1 was measured and found to be 0.44 μm (Ra indication according to JIS B 0601).

<Formation of Photosensitive Layer 1>

Coating solution (1) for photosensitive layer having the composition shown below was coated on Support 1 using a bar and dried in an oven at 90° C. for 60 seconds to form Photosensitive layer 1 having a dry coating amount of 1.3 g/m$^2$.

<Coating Solution (1) for Photosensitive Layer>

| | |
|---|---|
| Binder Polymer (1) (weight average molecular weight: 50,000) shown below | 0.04 g |
| Binder Polymer (2) (weight average molecular weight: 80,000) shown below | 0.30 g |
| Polymerizable Compound (1) shown below (PLEX 6661-O, produced by Degussa Japan Co., Ltd.) | 0.17 g |
| Polymerizable Compound (2) shown below | 0.51 g |
| Sensitizing Dye (1) shown below | 0.03 g |
| Sensitizing Dye (2) shown below | 0.015 g |
| Sensitizing Dye (3) shown below | 0.015 g |
| Polymerization Initiator (1) shown below | 0.13 g |
| Chain transfer agent Mercaprobenzothiazole | 0.01 g |
| Dispersion of ε-phthalocyanine pigment (pigment: 15 parts by weight; dispersing agent (allyl methacrylate/methacrylic acid copolymer (weight average molecular weight: 60,000, copolymerization molar ratio: 83/17)): 10 parts by weight; cyclohexanone: 15 parts by weight) | 0.40 g |
| Thermal polymerization inhibitor N-Nitrosophenylhydroxylamine aluminum salt | 0.01 g |
| Fluorine-Based Surfactant (1) (weight average molecular weight: 10,000) shown below | 0.001 g |
| 1-Methoxy-2-propanol | 3.5 g |
| Methyl ethyl ketone | 8.0 g |
| N,N-Dimethylaminopropyl methacrylamide | 0.015 g |

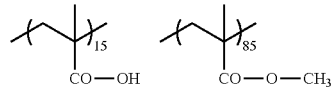

(Acid value: 85 mg KOH/g)

Binder Polymer (1)

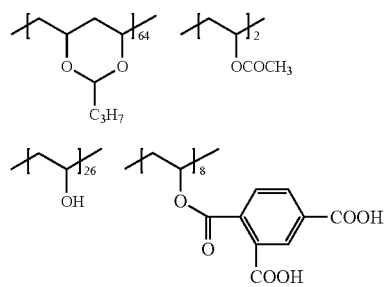

(Acid value: 66 mg KOH/g)

Binder Polymer (2)

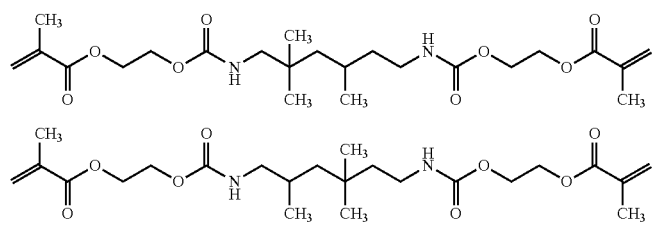

(Mixture of the isomers described above)

Polymerizable Compound (1)

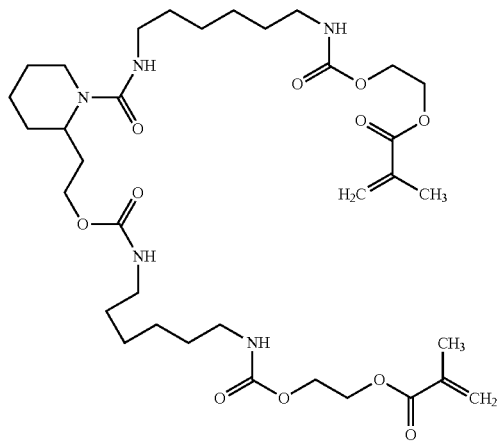 [SMILES: C=C(C)C(=O)OCCOC(=O)NCCCCCCNC(=O)OCCC1CCCCN1C(=O)NCCCCCCNC(=O)OCCOC(=O)C(=C)C]
Polymerizable Compound (2)
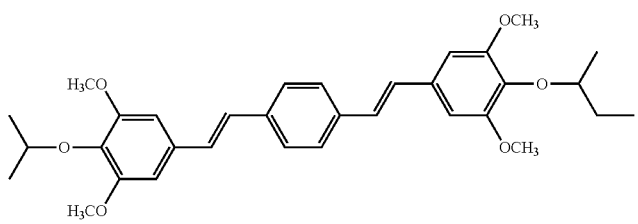 [SMILES: CCC(C)Oc1c(OC)cc(/C=C/c2ccc(/C=C/c3cc(OC)c(OC(C)C)c(OC)c3)cc2)cc1OC]
Sensitizing Dye (1)
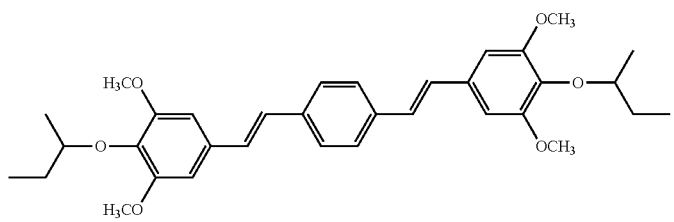 [SMILES: CCC(C)Oc1c(OC)cc(/C=C/c2ccc(/C=C/c3cc(OC)c(OC(C)CC)c(OC)c3)cc2)cc1OC]
Sensitizing Dye (2)
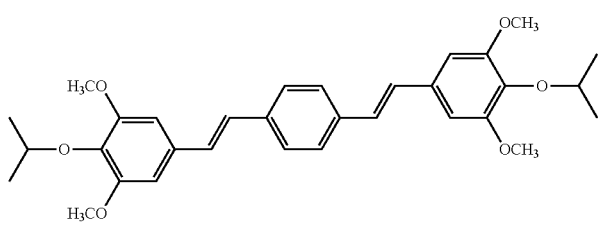 [SMILES: COc1cc(/C=C/c2ccc(/C=C/c3cc(OC)c(OC(C)C)c(OC)c3)cc2)cc(OC)c1OC(C)C]
Sensitizing Dye (3)
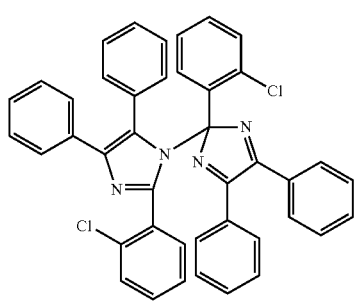 [SMILES: Clc1ccccc1-c1nc(-c2ccccc2)c(-c2ccccc2)n1C1(c2ccccc2Cl)N=C(c2ccccc2)C(c2ccccc2)=N1]
Polymerization Initiator(1)
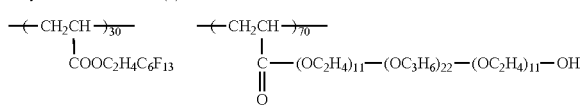
Fluorine-Based Surfactant (1)

<Formation of Protective Layer>

Each of Coating solutions (1) to (8) for protective layer having the composition shown below was coated on the photosensitive layer described above using a bar so as to have a dry coating amount of 1.2 g/m² and dried at 125° C. for 70 seconds to form a protective layer, thereby preparing Lithographic printing plate precursors 1 to 8, respectively.

<Coating Solutions (1) to (8) for Protective Layer>

| | |
|---|---|
| Protective layer polymer shown in Table A or Table B | 0.53 g |
| PVA-205 (partially hydrolyzed polyvinyl alcohol, produced by Kuraray Co., Ltd. (saponification degree: 86.5 to 89.5% by mole, viscosity: 4.6 to 5.4 mPa · s in a 4% by weight aqueous solution at 20° C.)) | 0.13 g |
| PVA-105 (fully hydrolyzed polyvinyl alcohol, produced by Kuraray Co., Ltd. (saponification degree: 98.0 to 99.0% by mole, viscosity: 5.2 to 6.0 mPa · s in a 4% by weight aqueous solution at 20° C.)) | 0.142 g |
| Vinyl pyrrolidone/vinyl acetate (1/1) copolymer (molecular weight: 70,000) | 0.001 g |
| Surfactant (EMALEX 710, produced by Nihon Emulsion Co., Ltd.) | 0.002 g |
| Water | 13 g |

Preparation of Lithographic Printing Plate Precursors 9 to 11

Each of Coating solutions (9) to (11) for protective layer having the composition shown below was coated on the photosensitive layer described above using a bar so as to have a dry coating amount of 1.2 g/m² and dried at 125° C. for 70 seconds to form a protective layer, thereby preparing Lithographic printing plate precursors 9 to 11, respectively.

<Coating Solutions (9) to (11) for Protective Layer>

| | |
|---|---|
| Protective layer polymer shown in Table A or Table B | 0.53 g |
| PVA-205 (partially hydrolyzed polyvinyl alcohol, produced by Kuraray Co., Ltd. (saponification degree: 86.5 to 89.5% by mole, viscosity: 4.6 to 5.4 mPa · s in a 4% by weight aqueous solution at 20° C.)) | 0.13 g |
| PVA-105 (fully hydrolyzed polyvinyl alcohol, produced by Kuraray Co., Ltd. (saponification degree: 98.0 to 99.0% by mole, viscosity: 5.2 to 6.0 mPa · s in a 4% by weight aqueous solution at 20° C.)) | 0.142 g |
| Dispersion of mica (1) shown below | 0.6 g |
| Vinyl pyrrolidone/vinyl acetate (1/1) copolymer (molecular weight: 70,000) | 0.001 g |
| Surfactant (EMALEX 710, produced by Nihon Emulsion Co., Ltd.) | 0.002 g |
| Water | 13 g |

(Preparation of Dispersion of Mica (1))

In 368 g of water was added 32 g of synthetic mica (SOMASIF ME-100, produced by CO-OP Chemical Co., Ltd., aspect ratio: 1,000 or more) and the mixture was dispersed using a homogenizer until the average particle diameter (measured by a laser scattering method) became 0.5 μm to obtain Dispersion of mica (1).

Preparation of Lithographic Printing Plate Precursors 12 to 14

<Preparation of Support 2>

An aluminum plate (material: 1050, refining: H16) having a thickness of 0.3 mm was immersed in an aqueous 10% by weight sodium hydroxide solution at 60° C. for 25 seconds to effect etching, washed with running water, neutralized and cleaned with an aqueous 20% by weight nitric acid solution and then washed with water. The aluminum plate was subjected to an electrolytic surface roughening treatment in an aqueous 1% by weight nitric acid solution using an alternating current with a sinusoidal waveform at an anode time electricity of 300 coulomb/dm². Subsequently, the aluminum plate was immersed in an aqueous 1% by weight sodium hydroxide solution at 40° C. for 5 seconds, immersed in an aqueous 30% by weight sulfuric acid solution at 60° C. for 40 seconds to effect a desmut treatment, and then subjected to an anodizing treatment in an aqueous 20% by weight sulfuric acid solution for 2 minutes under condition of current density of 2 A/dm² to form an anodic oxide film having a thickness of 2.7 g/m². Further, the aluminum plate was subjected to a hydrophilization treatment by immersing in an aqueous 1% polyvinylphosphonic acid solution at 60° C. for 10 seconds, washing at 20° C. with hard water having calcium ion concentration of 75 ppm for 4 seconds and then with pure water for 4 seconds, and drying, thereby preparing Support 2. The adhesion amount of calcium was 1.8 mg/m². The surface roughness of Support 2 was measured and found to be 0.28 μm (Ra indication according to JIS B 0601).

<Formation of Photosensitive Layer 2>

Coating solution (2) for photosensitive layer having the composition shown below was coated on Support 2 using a bar and dried in an oven at 90° C. for 60 seconds to form Photosensitive layer 2 having a dry coating amount of 1.3 g/m².

<Coating Solution (2) for Photosensitive Layer>

| | |
|---|---|
| Binder Polymer (1) (weight average molecular weight: 50,000) shown above | 0.34 g |
| Polymerizable Compound (1) shown above | 0.68 g |
| Sensitizing Dye (4) shown below | 0.06 g |
| Polymerization Initiator (1) shown above | 0.18 g |
| Chain Transfer Agent (1) shown below | 0.02 g |
| Dispersion of ε-phthalocyanine pigment (pigment: 15 parts by weight; dispersing agent (allyl methacrylate/methacrylic acid copolymer (weight average molecular weight: 60,000, copolymerization molar ratio: 83/17)): 10 parts by weight; cyclohexanone: 15 parts by weight) | 0.40 g |
| Thermal polymerization inhibitor N-Nitrosophenylhydroxylamine aluminum salt | 0.01 g |
| Fluorine-Based Surfactant (1) (weight average molecular weight: 10,000) shown above | 0.001 g |
| 1-Methoxy-2-propanol | 3.5 g |
| Methyl ethyl ketone | 8.0 g |

Sensitizing Dye (4)

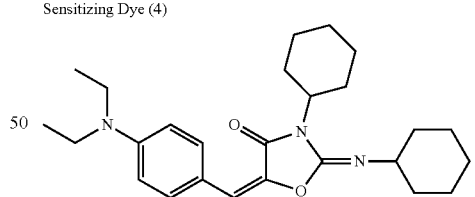

Chain TransferAgent (1)

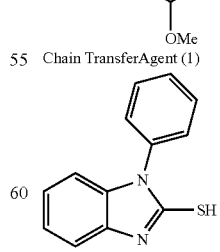

<Formation of Protective Layer>

Each of Coating solutions (12) to (14) for protective layer having the composition shown below was coated on Photosensitive layer 2 using a bar so as to have a dry coating amount of 1.5 g/m² and dried at 125° C. for 70 seconds to form a protective layer, thereby preparing Lithographic printing plate precursors 12 to 14, respectively.

<Coating Solutions (12) to (14) for Protective Layer>

| | |
|---|---:|
| Protective layer polymer shown in Table A or Table B | 0.53 g |
| Dispersion of mica (1) shown above | 0.6 g |
| Sulfonic acid-modified polyvinyl alcohol (GOSERAN CKS-50, produced by Nippon Synthetic Chemical Industry Co., Ltd. (saponification degree: 99% by mole; average polymerization degree: 300; modification degree: about 0.4% by mole)) | 0.2 g |
| Vinyl pyrrolidone/vinyl acetate (1/1) copolymer (weight average molecular weight: 70,000) | 0.001 g |
| Surfactant (EMALEX 710, produced by Nihon Emulsion Co., Ltd.) | 0.002 g |
| Water | 13 g |

Preparation of Lithographic Printing Plate Precursors 15 to 17

<Preparation of Support 3>

An aluminum plate (material: 1050, refining: H16) having a thickness of 0.3 mm was subjected to a degrease treatment with an aqueous 10% by weight sodium aluminate solution at 50° C. for 30 seconds in order to remove rolling oil on the surface thereof. Thereafter, the aluminum plate surface was grained using three nylon brushes implanted with bundled bristles having a diameter of 0.3 mm and an aqueous suspension (having specific gravity of 1.1 g/cm³) of pumice having a median diameter of 25 μm, and then thoroughly washed with water. The aluminum plate was etched by immersing it in an aqueous 25% by weight sodium hydroxide solution at 45° C. for 9 seconds and after washing with water, immersed in an aqueous 20% by weight nitric acid solution at 60° C. for 20 seconds, followed by washing with water. The etching amount of the grained surface was about 3 g/m².

Subsequently, the aluminum plate was subjected to a continuous electrochemical surface-roughening treatment using alternate current voltage of 60 Hz. The electrolytic solution used was an aqueous 1% by weight nitric acid solution (containing 0.5% by weight of aluminum ion) at a liquid temperature of 50° C. The electrochemical surface-roughening treatment was performed using a rectangular wave alternate current having a trapezoidal waveform such that the time TP necessary for the current value to reach the peak from zero was 0.8 msec and the duty ratio was 1:1, and disposing a carbon electrode as the counter electrode. The auxiliary anode used was ferrite. The current density was 30 A/dm² in terms of the peak value of current, and 5% of the current flowing from the power source was divided to the auxiliary anode. The quantity of electricity at the nitric acid electrolysis was 175 C/dm² when the aluminum plate was serving as the anode. Then, the aluminum plate was washed with water by spraying.

Then, the aluminum plate was subjected to an electrochemical surface-roughening treatment in the same manner as in the nitric acid electrolysis described above using, as the electrolytic solution, an aqueous 0.5% by weight hydrochloric acid solution (containing 0.5% by weight of aluminum ion) at a liquid temperature of 50° C. under the condition that the quantity of electricity was 50 C/dm² when the aluminum plate was serving as the anode, and then washed with water by spraying. The aluminum plate was then treated in an aqueous 15% by weight sulfuric acid solution (containing 0.5% by weight of aluminum ion) as the electrolytic solution at a current density of 15 A/dm² to provide a direct current anodic oxide film of 2.5 g/m², thereafter washed with water and dried. Then, the aluminum plate was treated with an aqueous 1% by weight sodium silicate solution at 20° C. for 10 seconds. The surface roughness of the aluminum plate thus-treated was measured and found to be 0.54 μm (Ra indication according to JIS B 0601).

Coating solution (1) for undercoat layer shown below was coated on the aluminum plate described above using a bar coater and dried at 80° C. for 20 seconds to prepare Support 3. The coating amount of the undercoat layer after drying was 15 mg/m².

<Coating Solution (1) for Undercoat Layer>

| | |
|---|---:|
| Polymer (SP3) shown below | 2.7 g |
| Pure water | 900.0 g |
| Methanol | 100.0 g |

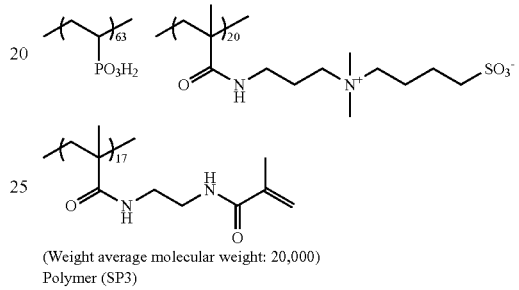

(Weight average molecular weight: 20,000)
Polymer (SP3)

<Formation of Photosensitive Layer 3>

Photosensitive layer 3 was formed on Support 3 in the same manner as in Photosensitive layer 1 except for using Coating solution (3) for photosensitive layer prepared by changing Binder Polymer (1) (weight average molecular weight: 50,000) in Coating solution (1) for photosensitive layer to Binder Polymer (3) (weight average molecular weight: 35,000) shown below.

Binder Polymer (3)

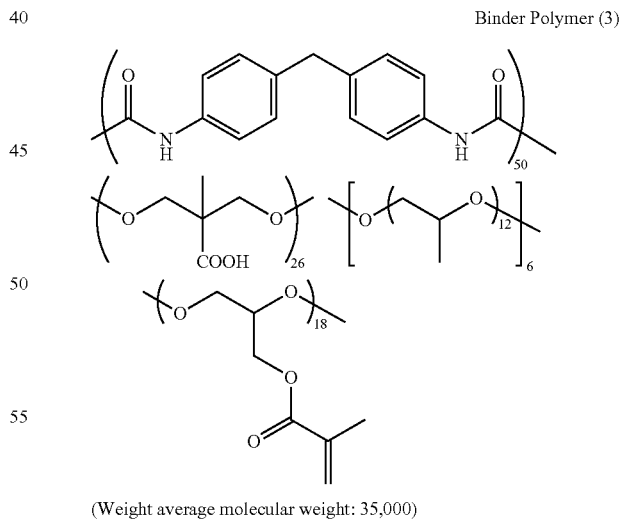

(Weight average molecular weight: 35,000)

<Formation of Protective Layer>

Each of Coating solutions (12) to (14) for protective layer described above was coated on Photosensitive layer 3 using a bar so as to have a dry coating amount of 1.5 g/m² and dried at 125° C. for 70 seconds to form a protective layer, thereby preparing Lithographic printing plate precursors 15 to 17, respectively.

Developers A to C having the composition shown below were prepared.

<Developer A>

| | |
|---|---|
| Nonionic surfactant (PLURONIC PE9400 (ethylene oxide-propylene oxide block copolymer) produced by BASF) | 2.5 g |
| Nonionic surfactant (EMULSOGEN TS 160 (2,4,6-tris(1-phenylethyl)phenol ethoxylate) produced by Clariant) | 2.5 g |
| 1-Phenoxy-2-propanol | 1.0 g |
| Triethanolamine | 0.6 g |
| Phosphoric acid (85%) | 0.3 g |
| Sodium gluconate | 1.0 g |
| Trisodium citrate | 0.5 g |
| Tetrasodium ethylenediaminetetraacetate | 0.05 g |
| Polystyrenesulfonic acid (VERSA TL 77, produced by Alco Chemical Inc. (30% by weight solution)) | 1.0 g |
| Water | 90.55 g |

(pH was adjusted to 6.9 by adding sodium hydroxide and phosphoric acid)

<Developer B>

| | |
|---|---|
| Surfactant-1 shown below (SOFTAZOLINE LPB-R, produced by Kawaken Fine Chemicals Co., Ltd.) | 15 g |
| Surfactant-2 shown below (SOFTAZOLINE LAO, produced by Kawaken Fine Chemicals Co., Ltd.) | 4 g |
| Chelating agent: Trisodium ethylenediaminesuccinate (ENVIOMET C140, produced by Innospec Specialty Chemicals Inc.) | 0.68 g |
| 2-Bromo-2-nitropropane-1,3-diol | 0.025 g |
| 2-Methyl-4-isothiazoline-3-one | 0.025 g |
| Silicone type deforming agent (TSA 739, produced by GE Toshiba Silicone Co., Ltd.) | 0.15 g |
| Sodium gluconate | 1.5 g |
| Sodium carbonate | 1.06 g |
| Sodium hydrogen carbonate | 0.52 g |
| Water | 77.04 g |

(pH: 9.8)

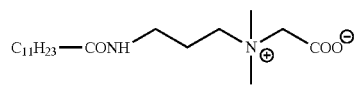

SOFTAZOLINE LPB-R
Surfactant-1

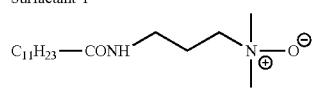

SOFTAZOLINE LAO
Surfactant-2

<Developer C>

| | |
|---|---|
| Surfactant-3: Polyoxyethylene naphthyl ether (NEWCOL B-13, produced by Nippon Nyukazai Co., Ltd.) | 3 g |
| Chelating agent: Trisodium ethylenediaminesuccinate (OCTAQUEST E30, produced by Innospec Specialty Chemicals Inc.) | 0.68 g |
| 2-Bromo-2-nitropropane-1,3-diol | 0.025 g |
| 2-Methyl-4-isothiazoline-3-one | 0.025 g |
| Silicone type deforming agent (TSA 739, produced by GE Toshiba Silicone Co., Ltd.) | 0.15 g |
| Sodium gluconate | 1.5 g |
| Sodium carbonate | 1.06 g |
| Sodium hydrogen carbonate | 0.52 g |
| Water | 77.04 g |
| Lipase (NS44126, produced by Novozymes Japan Ltd.) | 0.3 g |

(pH: 9.8)

<Image Exposure>

The lithographic printing plate precursor was subjected to image exposure using a violet semiconductor laser plate setter Vx9600 (having InGaN semiconductor laser (emission wavelength: 405 nm±10 nm/output: 30 mW)) produced by FUJIFILM Electronic Imaging Ltd. The image exposure was performed using an FM screen (TAFFETA 20, produced by FUJIFILM Corp.) under conditions including a resolution of 2,438 dpi, a halftone dot area of 50% and a plate surface exposure amount of 0.05 mJ/cm$^2$.

<Development Processing>

In Examples 1 to 5 and Comparative Examples 1 to 7, the lithographic printing plate precursor image-exposed was subjected to development processing by a development device having the configuration as shown in FIG. 1 using each developer shown in Table A below. The heating condition in the pre-heat unit 150 was at 100° C. for 10 sec. The liquid temperature of the developer was 25° C. The transport speed of the lithographic printing plate precursor was set so as to take transit time of 20 seconds from installation of the lithographic printing plate precursor by the transport roller pair 22 disposed on the upstream side in the tank 20 of the first processing unit to discharge of the lithographic printing plate precursor by the transport roller pair 24 disposed on the downstream side in the tank 20. The rubbing member 26 was set to drive in the same direction as the transporting direction. The outer diameter of the rubbing member 26 was ϕ50 mm. The lithographic printing plate precursor discharged from the tank 20 of the first processing unit 2 was subjected to processing by spraying of the developer in the second processing unit 30 and thereafter dried in the drying unit 152. The drying temperature (on the surface of plate) was about 55° C. The third processing unit was used only its transport function.

In Examples 6 to 9 and Comparative Examples 8 and 9, the lithographic printing plate precursor image-exposed was subjected to development processing by an automatic development processor having the configuration as shown in FIG. 2 using each developer shown in Table B below. The temperature of the pre-heat unit was 100° C., the temperature of the developer was 25° C., the development time (time for immersion of the lithographic printing plate precursor in the developer) was 21 seconds, and the temperature of the drying unit was 80° C.

<Evaluation>

As to each lithographic printing plate precursor, the development speed was evaluated in the manner shown below. Also, the development scum, stain resistance and ink receptivity under the conditions of the image exposure and development processing described above were evaluated in the manner shown below.

<Development Speed>

The lithographic printing plate precursor was stored under the storage environment of 30° C. and 75% RH for 10 days and then, without conducting image exposure, heat treatment and water washing treatment, subjected to development processing using an automatic developing machine LP-1310HII produced by FUJIFILM Corp. of one bath development processing type at transport speed (line speed) of 2 m/min and development temperature of 25° C. In Examples 1 to 5 and Comparative Examples 1 to 7, the developer of first step shown in Table A was used, and in Examples 6 to 9 and Comparative Examples 8 and 9, the developer shown in Table B was used.

As to the non-image area density of the lithographic printing plate obtained by the development, cyan density was measured by a Macbeth reflection densitometer RD-918 using a red filter equipped in the densitometer. Taking the density value of the support after the completion of the hydrophilizing surface treatment and before the coating of the protective layer, photosensitive layer and undercoat layer as 0.00, the non-image area density was evaluated according to the criteria shown below.

A: The density value is +0.02 or less in comparison with the density value of the support and there is no problem in the practical use.

B: The density value is larger than +0.02 and less than +0.03 in comparison with the density value of the support and is practically acceptable.

C: The density value is +0.03 or more in comparison with the density value of the support and is practically unacceptable.

<Development Scum>

Regarding 10 plates (3.0 m$^2$) of the lithographic printing plates obtained, contamination on the plate (number of scums adhered on the plate) was visually observed, and based on the number of scums per unit area (1 m$^2$), the development scum was evaluated according to the criteria shown below.

A: Less than 1 piece
B: From 1 to 2 pieces
C: From 3 to 5 pieces
D: From 6 to 8 pieces
E: 9 Pieces or more <Ink Receptivity>

The lithographic printing plate obtained was subjected to printing using a printing machine, DIA 1F-2 produced by Mitsubishi Heavy Industries, Ltd. As the printing ink, GRAF G(N) produced by Dainippon Ink & Chemicals, Inc. was used, and as the dampening water, IF MARK II produced by FUJIFILM Corp. was used. After the initiation of printing, the printing ink gradually adhered to the image area and as a result, the ink density on paper increased. A number of the printing sheets when the ink density reached the standard printed material density (Macbeth reflection density D=1.80) was determined and evaluated as the ink receptivity according to the criteria shown below. The smaller the number of printing sheet, the more excellent the ink receptivity.

A: The number of sheets for ink reception is 12 sheets or less.
B: The number of sheets for ink reception is from 13 to 14 sheets.
C: The number of sheets for ink reception is from 15 to 20 sheets.
D: The number of sheets for ink reception is 25 sheets or more.

<Stain Resistance>

After printing 10,000 sheets under the conditions described above with the lithographic printing plate, stain of the portion corresponding to the non-image area on the blanket was visually observed, and evaluated according to the criteria shown below.

A: The stain on the blanket is not recognized at all.
B: The stain on the blanket is hardly recognized.
C: The stain on the blanket is clearly recognized.

The evaluation results are shown in Table A and Table B.

TABLE A

| | Protective Layer Polymer | Lithographic Printing Plate Precursor | Development Processing | First Step | Second Step | Development Scum | Development Speed | Stain Resistance | Ink Receptivity |
|---|---|---|---|---|---|---|---|---|---|
| Example 1 | Polymer 1 | Lithographic Printing Plate Precursor 1 | 2 Steps | Developer A | Developer A | A | A | A | A |
| Example 2 | Polymer 2 | Lithographic Printing Plate Precursor 2 | 2 Steps | Developer A | Developer A | A | A | A | A |
| Example 3 | Polymer 1 | Lithographic Printing Plate Precursor 9 | 2 Steps | Developer A | Developer A | B | A | A | A |
| Example 4 | Polymer 2 | Lithographic Printing Plate Precursor 10 | 2 Steps | Developer A | Developer A | A | A | A | A |

TABLE A-continued

| | Protective Layer Polymer | Lithographic Printing Plate Precursor | Development Processing | First Step | Second Step | Development Scum | Development Speed | Stain Resistance | Ink Receptivity |
|---|---|---|---|---|---|---|---|---|---|
| Example 5 | Polymer 1 (acrylamide/t-butyl acrylate 76/24 copolymer) | Lithographic Printing Plate Precursor 1 | 2 Steps | Developer A | Developer B | A | B | A | A |
| Comparative Example 1 | PVA 405 | Lithographic Printing Plate Precursor 3 | 2 Steps | Developer A | Developer A | E | C | C | C |
| Comparative Example 2 | Polymer 3 (ethyl acrylate/sulfonated acrylamide 85/16 copolymer) | Lithographic Printing Plate Precursor 4 | 2 Steps | Developer A | Developer A | C | A | B | C |
| Comparative Example 3 | Polymer 4 (PO(OH)₂ / ethylene glycol dimethacrylate / dimethylacrylamide 85/10/5 terpolymer) | Lithographic Printing Plate Precursor 5 | 2 Steps | Developer A | Developer A | C | A | B | C |
| Comparative Example 4 | Polymer 5 (t-butyl acrylate homopolymer 100) | Lithographic Printing Plate Precursor 6 | 2 Steps | Developer A | Developer A | E | C | C | C |
| Comparative Example 5 | Polymer 6 (acrylamide/sulfonated acrylamide 98/2 copolymer) | Lithographic Printing Plate Precursor 7 | 2 Steps | Developer A | Developer A | C | A | A | D |
| Comparative Example 6 | Polymer 7 (t-butyl acrylate/sulfonated acrylamide 85/15 copolymer) | Lithographic Printing Plate Precursor 8 | 2 Steps | Developer A | Developer A | D | C | B | C |

TABLE A-continued

| | Protective Layer Polymer | Lithographic Printing Plate Precursor | Development Processing | First Step | Second Step | Development Scum | Development Speed | Stain Resistance | Ink Receptivity |
|---|---|---|---|---|---|---|---|---|---|
| Comparative Example 7 | PVA 405 | Lithographic Printing Plate Precursor 11 | 2 Steps | Developer A | Developer A | E | C | C | C |

TABLE B

| | Protective Layer Polymer | Lithographic Printing Plate Precursor | Development Processing | Developer | Development Scum | Development Speed | Stain Resistance | Ink Receptivity |
|---|---|---|---|---|---|---|---|---|
| Example 6 | Polymer 1 (acrylamide 76 / t-butyl acrylate 24) | Lithographic Printing Plate Precursor 12 | 1 Step | Developer B | B | A | A | B |
| Example 7 | Polymer 2 (acrylamide 74 / t-butyl acrylate 25 / sulfonate acrylamide 1) | Lithographic Printing Plate Precursor 13 | 1 Step | Developer B | B | A | A | B |
| Example 8 | Polymer 1 (acrylamide 76 / t-butyl acrylate 24) | Lithographic Printing Plate Precursor 15 | 1 Step | Developer C | A | A | A | A |
| Example 9 | Polymer 2 (acrylamide 74 / t-butyl acrylate 25 / sulfonate acrylamide 1) | Lithographic Printing Plate Precursor 16 | 1 Step | Developer C | A | A | A | A |
| Comparative Example 8 | PVA 405 | Lithographic Printing Plate Precursor 14 | 1 Step | Developer B | E | C | C | C |
| Comparative Example 9 | PVA 405 | Lithographic Printing Plate Precursor 17 | 1 Step | Developer C | E | C | C | C |

From the results shown in Table A and Table B it can be seen that the lithographic printing plate precursor having the protective layer containing the specific polymer according to the invention provides the lithographic printing plate excellent in stain resistance and ink receptivity while preventing from the occurrence of development scum without causing decrease in a development speed in comparison with the lithographic printing plate precursor having the protective layer containing the polymer other than the specific polymer according to the invention.

INDUSTRIAL APPLICABILITY

According to the invention, a lithographic printing plate precursor which is prevented from the occurrence of development scum without causing decrease in a development speed and provides a lithographic printing plate excellent in stain resistance and ink receptivity can be provided. Also, the lithographic printing plate excellent in stain resistance and ink receptivity can be provided while preventing from the occurrence of development scum without causing decrease in a development speed by conducting the development processing consisting of a plurality of steps using the lithographic printing plate precursor. Further, the lithographic printing plate excellent in stain resistance and ink receptivity can also be provided while preventing from the occurrence of development scum without causing decrease in a development speed by conducting the development processing consisting of a single step using the lithographic printing plate precursor.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Sep. 30, 2011 (Japanese Patent Application No. 2011-218547), and the contents thereof are incorporated herein by reference.

DESCRIPTION OF REFERENCE NUMERALS AND SIGNS

1: Processing device for lithographic printing plate
2: First processing unit
3: Second processing unit
4: Third processing unit
20, 30, 40: Tank
60: Replenishment unit
80: Pipe
84: Tank
86: Pump
100: Automatic development processor
200: Pre-heating (pre-heat) unit
300: Developing unit
308: Developing tank
400: Drying unit

The invention claimed is:

1. A lithographic printing plate precursor comprising a photosensitive layer and a protective layer in this order on a support, wherein the photosensitive layer contains a sensitizing dye, a polymerization initiator, a polymerizable compound and a binder polymer, and the protective layer contains a polymer which has a repeating unit represented by the following formula (1) and a repeating unit represented by the following formula (2) in which a sum of the repeating unit represented by the formula (1) and the repeating unit represented by the formula (2) is 90% by mole or more based on total repeating units constituting the polymer:

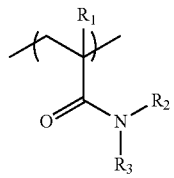

Formula (1)

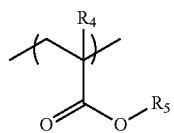

Formula (2)

wherein, in the formulae (1) and (2), $R_1$ and $R_4$ each represents a hydrogen atom or a methyl group, $R_2$ and $R_3$, which may be same or different, each represents a hydrogen atom, a methyl group or an ethyl group, and $R_5$ represents an unsubstituted alkyl group having from 1 to 8 carbon atoms or an alkyl group substituted with an aromatic group or a heterocyclic group.

2. The lithographic printing plate precursor as claimed in claim 1, wherein the binder polymer is a polyvinyl butyral resin.

3. The lithographic printing plate precursor as claimed in claim 1, wherein the protective layer contains an inorganic stratiform compound.

4. A method for producing a lithographic printing plate comprising subjecting the lithographic printing plate precursor as claimed in claim 1 to image exposure and development processing.

5. The method for producing a lithographic printing plate as claimed in claim 4, wherein the development processing consists of a plurality of steps.

6. The method for producing a lithographic printing plate as claimed in claim 4, wherein the development processing consists of one step.

7. The method for producing a lithographic printing plate as claimed in claim 4, wherein a developer used in the development processing contains two or more kinds of surfactants.

8. The lithographic printing plate precursor as claimed in claim 1, wherein the binder polymer is represented by the following formula (II):

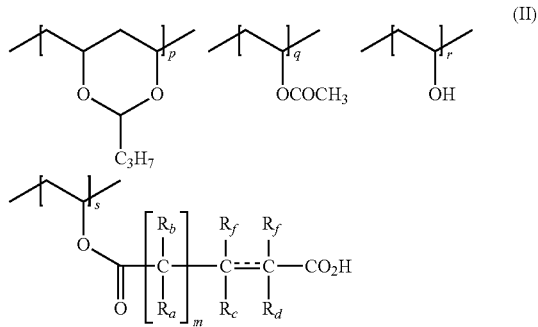

wherein a ratio of each repeating unit p/q/r/s is in a range from 50 to 78% by mole/from 1 to 5% by mole/from 5 to 28% by mole/from 5 to 20% by mole.

9. The lithographic printing plate precursor as claimed in claim 1, wherein the sensitizing dye has an absorption maximum in a wavelength range from 300 to 450 nm.

10. The method for producing a lithographic printing plate as claimed in claim 4, which does not contain a water washing treatment after the development processing.

11. The method for producing a lithographic printing plate as claimed in claim 4, wherein the development processing is conducted with a developer having pH from 2.0 to 10.0.

* * * * *